(12) United States Patent
Ono et al.

(10) Patent No.: US 6,217,987 B1
(45) Date of Patent: Apr. 17, 2001

(54) SOLDER RESIST COMPOSITION AND PRINTED CIRCUIT BOARDS

(75) Inventors: Yoshitaka Ono; Akihiko Goto; Ayao Niki; Motoo Asai, all of Gifu (JP)

(73) Assignee: Ibiden Co. Ltd., Gifu (JP)

( * ) Notice: Subject to any disclaimer, the term of this patent is extended or adjusted under 35 U.S.C. 154(b) by 0 days.

(21) Appl. No.: 08/931,364

(22) Filed: Sep. 16, 1997

(30) Foreign Application Priority Data

Nov. 20, 1996 (JP) .................................. 8-308844
Nov. 20, 1996 (JP) .................................. 8-308845
Nov. 20, 1996 (JP) .................................. 8-308846
Dec. 27, 1996 (JP) .................................. 8-357962

(51) Int. Cl.$^7$ .................................................. B32B 3/00
(52) U.S. Cl. .......................... 428/209; 428/901; 174/250; 174/255; 174/256; 430/280.1
(58) Field of Search ............................... 430/280, 280.1; 428/209, 901; 174/250, 255, 256

(56) References Cited

U.S. PATENT DOCUMENTS

| | | | |
|---|---|---|---|
| 3,356,624 | 12/1967 | Neal et al. | 260/18 |
| 4,504,607 | 3/1985 | Leech | 523/427 |
| 4,510,276 | 4/1985 | Leech et al. | 523/427 |
| 4,615,950 | 10/1986 | Hung et al. | 428/461 |
| 4,713,298 | 12/1987 | Hung et al. | 428/461 |
| 4,750,976 | 6/1988 | Hupe et al. | 204/15 |
| 4,752,499 | 6/1988 | Enomoto | 427/98 |
| 4,820,549 | 4/1989 | Ozaki et al. | 427/98 |
| 4,888,269 | 12/1989 | Sato et al. | 430/280 |
| 4,902,726 | 2/1990 | Hayashi et al. | 522/18 |
| 4,948,700 | 8/1990 | Maeda et al. | 430/280 |
| 4,990,395 | 2/1991 | Hupe et al. | 428/216 |
| 5,009,982 | 4/1991 | Kamayachi et al. | 430/280 |
| 5,021,472 | 6/1991 | Enomoto | 523/427 |
| 5,055,321 | 10/1991 | Enomoto et al. | 427/98 |
| 5,055,378 | 10/1991 | Miyamura et al. | 430/280 |
| 5,061,744 | * 10/1991 | Ogitani et al. | 523/216 |
| 5,137,936 | 8/1992 | Akiguchi et al. | 522/170 |
| 5,175,060 | 12/1992 | Enomoto et al. | 428/620 |
| 5,302,492 | 4/1994 | Ott et al. | 430/314 |
| 5,519,177 | * 5/1996 | Wang et al. | 174/259 |
| 5,532,094 | 7/1996 | Arimura et al. | 252/97.1 |
| 5,741,575 | * 4/1998 | Asai et al. | 428/209 |
| 5,753,722 | * 5/1998 | Itokawa et al. | 522/129 |
| 5,948,514 | * 9/1999 | Komori et al. | 428/209 |

FOREIGN PATENT DOCUMENTS

| | | |
|---|---|---|
| 3717199 | 11/1987 | (DE) . |
| 3925895 | 2/1990 | (DE) . |
| 402811 | 12/1990 | (EP) . |
| 623852 | 11/1994 | (EP) . |
| 2580828 | 10/1986 | (FR) . |
| 5790072 | 6/1982 | (JP) . |
| 60-208377 | 10/1985 | (JP) . |
| 61-59447 | 3/1986 | (JP) . |
| 6223036 | 1/1987 | (JP) . |
| 62-265321 | 11/1987 | (JP) . |
| 63-286841 | 11/1988 | (JP) . |
| 1142547 | 6/1989 | (JP) . |
| 1197744 | 8/1989 | (JP) . |
| 1253730 | 10/1989 | (JP) . |
| 5-32746 | 2/1993 | (JP) . |
| 6267964 | 9/1994 | (JP) . |
| 8242064 | 9/1996 | (JP) . |

OTHER PUBLICATIONS

Patent Abstracts of Japan, vol. 97, No. 1 (Jan. 31, 1997).
Patent Abstracts of Japan, vol. 95, No. 1 (Feb. 28, 1995).

(List continued on next page.)

*Primary Examiner*—Cathy Lam
(74) *Attorney, Agent, or Firm*—Greenblum & Berstein, P.L.C.

(57) ABSTRACT

A solder resist composition comprises an acrylate of novolac type epoxy resin and an imidazole curing agent and has a viscosity of 0.5–10 Pa·s adjusted with glycol ether type solvent. A printed circuit board is formed by using such a solder resist composition.

33 Claims, 21 Drawing Sheets

OTHER PUBLICATIONS

Patent Abstracts of Japan, vol. 17, No. 640 (Nov. 26, 1993).
Patent Abstracts of Japan, vol. 13, No. 343 (Aug. 2, 1989).
Patent Abstracts of Japan, vol. 18, No. 673 (Dec. 19, 1994).
Patent Abstracts of Japan, vol. 10, No. 67 (Mar. 15, 1986).
Patent Abstracts of Japan, vol. 13, No. 495 (Nov. 9, 1989).
Patent Abstracts of Japan, vol. 17, No. 327 (Jun. 22, 1993).
Patent Abstract of Japan, vol. 14, No. 1 (P–985), published Jan. 8, 1990.
Derwent Abstract No. 89–342841.
English language abstract of JP–57–90072.
English language abstract of JP–61–59447.
English language abstract of JP–62–265321.
English language abstract of–JP–1–142547.
English language abstract of–JP–63–286841.
English language abstract of–JP–62–23036.
English language abstract of–JP–8–242064.
European Divisional Search Report and Annex for EPO 97 11 0145.
European Search Report and Annex for EPO 94 10 7156.

* cited by examiner

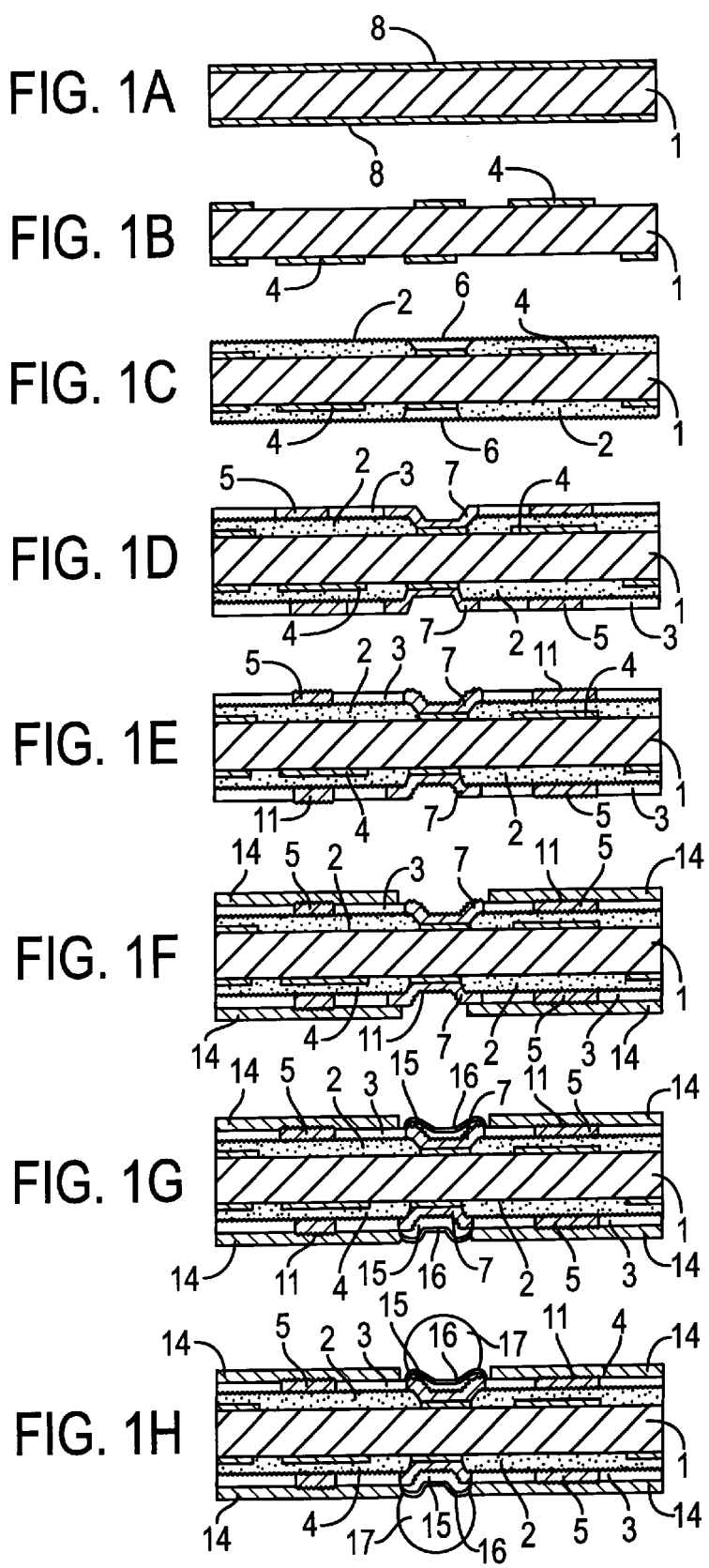

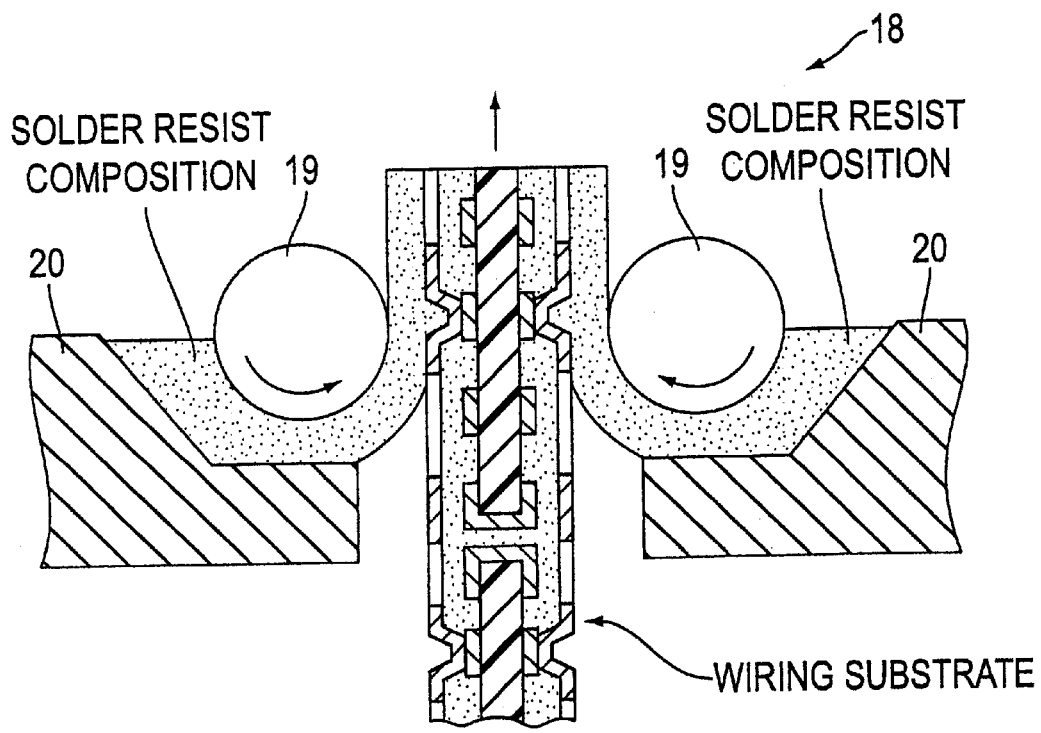
FIG. 2A
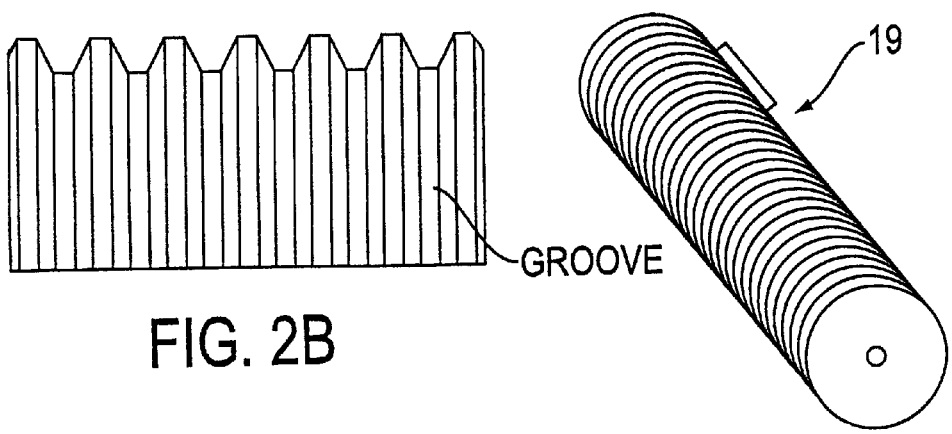
FIG. 2B
FIG. 2C

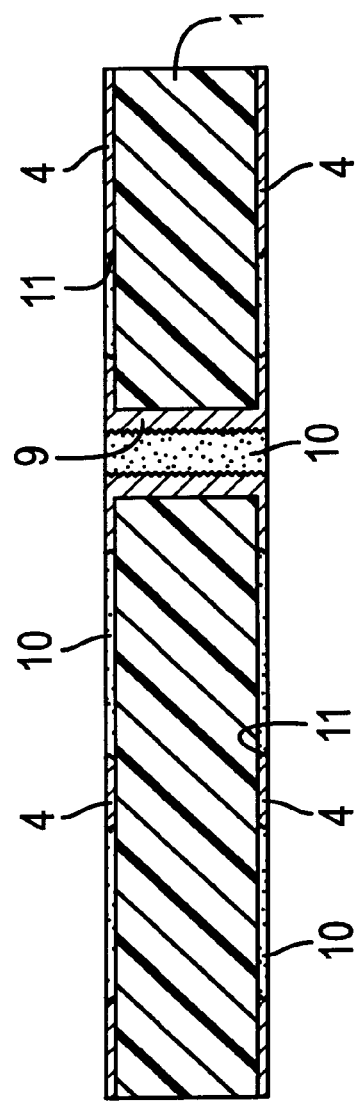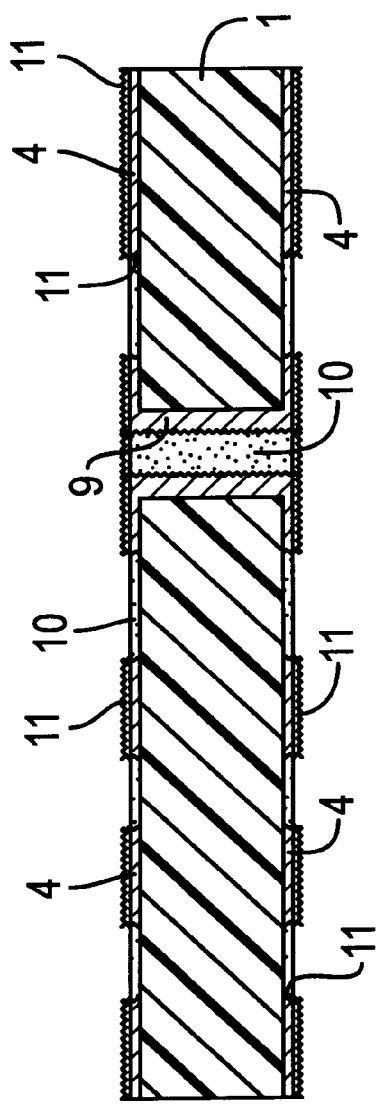

SOLDER RESIST COMPOSITION AND PRINTED CIRCUIT BOARDS

BACKGROUND OF THE INVENTION

1. Field of the Invention

This invention relates to a solder resist composition and a printed circuit board, and more particularly to a solder resist composition capable being easily applied by a roller coater and having less lead migration as well as a printed circuit board using such a solder resist composition.

2. Description of Background Art

A solder resist layer is formed on an outermost surface layer portion of a printed circuit board. This solder resist layer possesses a function of protecting a conductor circuit exposed at the surface layer portion and a function as a dam for preventing solder flowing and solder bridge of a solder body (for example, solder bump) supplied onto surfaces of pads to be mounted with an electronic component.

As a resin composition for the formation of the solder resist layer, a solder resist composition obtained by dissolving epoxy acrylate and an imidazole curing agent in cellosolve acetate and adjusting a viscosity thereof to 0.1–0.2 Pa·s, and the like are used as disclosed, for example, in JP-A-63-286841 (U.S. Pat. No. 4,902,726).

Furthermore, an alkali-developing type solder resist composition is disclosed in JP-A-62-23036.

However, when the resin composition disclosed in JP-A-63-286841 is used as a solder resist layer, lead ion diffuses from the solder body (solder bump or the Like) formed on the pad into the solder resist layer (this phenomenon is called lead migration) and hence there is a problem of causing electrical conduction between the pads to form a short-circuit. Furthermore, when the resin composition disclosed in JP-A-62-23036 is used as a solder resist layer, the above phenomenon is also caused to form a short-circuit.

On the other hand, when the above resin composition is applied to a copper pattern and then dried, the copper pattern under the resin layer is oxidized. If nickel-gold plating is carried out, the oxidized layer of the copper pattern is dissolved to bring about discoloration known as the hallow phenomenon.

And also, when the above resin composition is used as the solder resist layer, there is a problem of easily peeling the solder resist layer due to heat cycle.

Moreover, a basic specification of the printed circuit board is double-sided wiring board, so that the solder resist composition should be applied onto both surfaces of the wiring board. For this purpose, when a method of sandwiching the wiring substrate between a pair of rolls in a roll coater at a vertically standing state and applying the solder resist composition to both surfaces of the substrate at the same time is adopted as a best application form, the solder resist composition of the conventional technique has a problem in that dropping is caused because of low viscosity.

On the other hand, there has been known a flip chip mounting method wherein solder bumps are arranged on the pads formed on the wiring substrate and connected to an IC chip as a conventional technique suitable for the high densification of mounting components.

This flip chip mounting is a technique wherein conductor circuits including pads are formed on the surface of the printed wiring substrate to be mounted and a solder is fed to resist-opening portions through the solder resist to form solder bumps on the pads and then the solder bumps are subjected to a reflowing treatment to conduct electrical connection between the solder bump and IC chip (electronic component).

However, when the flip chip mounting is applied to an additive type printed circuit board obtained by directly forming a conductor circuit on an insulating resin layer through a permanent resist, there is a problem that the solder bump is apt to be peeled off from the pad surface in the heat cycle.

Moreover, the Applicant has already proposed a printed circuit board having an excellent adhesion property between solder resist layer and metal pad as a technique capable of preventing the peeling of the solder resist layer (see Japanese Patent Application No. 7-68656). Such a proposed technique is a method of forming a solder body through electroless plating wherein a surface of a metal pad is roughened and a copper layer is formed thereon and then substitution plating of copper with tin or tin unhomogeneous plating and further substitution plating of lead are carried out thereon.

However, this technique has problems in that it takes a long time and a high cost and the mass productivity is poor.

Furthermore, the surface of the copper layer is liable to be oxidized and it is difficult to maintain a pure metal surface. If the surface is oxidized, the wettability to solder is poor and hence it is difficult to form solder by a method suitable for mass production such as solder transferring method, solder printing method or the like.

SUMMARY OF THE INVENTION

It is, therefore, an object of the invention to solve the aforementioned problems of known techniques and to develop a solder resist composition capable of being easily applied by a roll coater and having less lead migration.

It is an object of the invention to propose a printed circuit board capable of effectively preventing the peeling of the solder resist layer due to the hallow phenomenon, heat cycle or the like.

It is yet another object of the invention to propose a printed circuit board having an excellent mounting reliability which realizes the formation of the solder body through solder transferring method or solder printing method to ensure the mass productivity of the printed circuit board and can effectively prevent the peeling of the solder resist layer or the solder bump (solder body).

The inventors have made various studies in order to achieve the above objects and as a result the following discoveries are obtained.

① The resin composition described in JP-A-63-286841 is low in viscosity (0.1–0.2 Pa·s) and has a gap between molecular chains, so that even when it is dried and cured by exposing to a light, the curing rate is low and the gap still remains. Therefore, it is considered that lead ion migrates in the gap.

② In the resin composition described in JP-A-62-23036, carboxylic acid is introduced into epoxy group, so that molecular chain is chemically cut in the alkali development to roughen the developed surface and hence it is considered that lead ion is diffused from the roughened surface.

③ In the resin composition containing cellosolve acetate as a solvent, —COOR is decomposed to form free oxygen (O), which is considered to oxidize copper surface.

④ The resin composition described in JP-A-63-286841 is lacking in flexibility because of a resin having a rigid skeleton. Therefore, when this resin composition is used as a solder resist composition, it is considered that the solder resist layer can not absorb the difference of thermal expansion coefficient to metal (conductor layer) due to heat cycle and peeling is caused.

⑤ The solder resist layer is formed on the outermost surface layer portion of the printed circuit board, so that it is apt to be influenced by external atmosphere. Therefore, when such a printed circuit board is exposed to conditions of high temperature, high humidity and high pressure, it is considered that the resin as a main component is swollen by absorbing water to peel off the solder resist layer from the wiring substrate.

⑥ The additive type printed circuit board is a wiring substrate directly forming conductor circuit inclusive of pads on the insulating resin layer, which is different from a subtractive type multilayer printed circuit board using a glass cloth. in such a printed circuit board, the thermal expansion coefficient of the surface layer portion of the wiring substrate provided with the solder body is dependent upon the thermal expansion coefficient of the insulating resin layer. Therefore, it is considered that the difference of thermal expansion coefficient between the surface layer portion of the wiring substrate provided with the solder body and IC chip mounted through the solder body becomes very large and the solder body is subjected to a large stress to peel from the pad surface.

The invention is based on the above discoveries and constructed as follows.

(1) It is a solder resist composition comprising an acrylate of novolac epoxy resin and an imidazole curing agent and having a viscosity of 0.5–10 Pa·s at 25° C. adjusted by using a glycol ether solvent. In the solder resist composition, the imidazole curing agent is preferably liquid at room temperature. Further, the solder resist composition preferably contains a polymer of acrylic ester.

(2) It is a printed circuit board comprising a wiring substrate provided with conductor circuits and a solder resist layer formed on a surface of the substrate, in which the solder resist layer is formed by curing a solder resist composition comprising an acrylate of novolac epoxy resin and an imidazole curing agent and having a viscosity of 0.5–10 Pa·s at 25° C. adjusted by using a glycol ether solvent.

(3) It is a printed circuit board comprising a wiring substrate provided with conductor circuits and a solder resist layer formed on a surface of the substrate, in which a roughening layer is formed on a surface of the conductor circuit.

In the printed circuit board, the roughened layer preferably has a thickness of 0.5–10 μm and an alloy layer of copper-nickel-phosphorus. In the printed circuit board, the solder resist layer is preferably made from a composition comprising a novolac epoxy resin or an acrylate of novolac epoxy resin and an imidazole curing agent, or formed by curing a solder resist composition comprising an acrylate of novolac epoxy resin and an imidazole curing agent and having a viscosity at 25° C. of 0.5–10 Pa·s at 25° C. adjusted by using a glycol ether solvent, and have a thickness of 5–30 μm. Further, the solder resist composition preferably contains a polymer of acrylic ester. in the printed circuit board, it is preferable that the wiring substrate is formed by forming a plating resist on a roughened surface of an insulating resin layer and forming a conductor circuit on a non-resist formed portion of the plating resist.

(4) It is a printed circuit board comprising a wiring substrate provided with conductor circuits, a solder resist layer formed on the surface of the substrate, and a solder body fed onto a pad as a part of the conductor circuit exposed from an opening portion formed in the solder resist layer, in which the solder resist layer is made from a composition comprising an acrylate of novolac epoxy resin and an imidazole curing agent.

(5) It is a printed circuit board comprising a wiring substrate provided with conductor circuits, a solder resist layer formed on the surface of the substrate, and a solder body fed onto a pad as a part of the conductor circuit exposed from an opening portion formed in the solder resist layer, in which the surface of the pad is rendered into an electrically conductive roughened layer, and a metal layer having a non-oxidizing metal on at least a surface thereof is formed on a surface of the pad exposed from the opening portion, and the solder is supported on the pad through the metal layer.

(6) It is a printed circuit board comprising a wiring substrate provided with conductor circuits, a solder resist layer formed on the surface of the substrate, and a solder body fed onto a pad as a part of the conductor circuit exposed from an opening portion formed in the solder resist layer, in which the surface of the conductor circuit is rendered into an electrically conductive roughened layer, and a metal layer having a non-oxidizing metal on at least a surface thereof is formed on a surface of the pad exposed from the opening portion, and the solder is supported on the pad through the metal layer.

In the printed circuit boards of the above items (4), (5), (6), the solder resist layer is preferably formed by curing a solder resist composition comprising an acrylate of novolac epoxy resin and an imidazole curing agent and having a viscosity of 0.5–10 Pa·s at 25° C. adjusted by using a glycol ether solvent and to have a thickness of 5–30 μm. The solder resist composition preferably contains a polymer of acrylic ester. Furthermore, it is preferable that the full surface of the pad is exposed in the opening portion or a part of the surface of the pad is exposed in the opening portion. And also, the metal layer is preferably composed of nickel layer and gold layer, or of copper layer, nickel layer and gold layer. Moreover, the electrically conductive roughened layer preferably has a thickness of 0.5–7 μm and an alloy layer of copper-nickel-phosphorus. In the printed circuit board, it is preferable that the wiring substrate is formed by forming a plating resist on a roughened surface of an insulating resin layer and forming a conductor circuit on a non-resist formed portion of the plating resist.

BRIEF DESCRIPTION OF THE DRAWINGS

FIG. 1 is a flow chart showing production steps of an embodiment of the printed circuit board according to the invention;

FIG. 2(a) is a diagrammatic view illustrating a step of applying a solder resist composition according to the invention;

FIG. 2(b) is a diagrammatic view showing a surface structure of a roll used in the application step;

FIGS. 26–45 are flow charts showing production steps of another embodiment of the printed circuit board according to the invention;

Figure 3A:
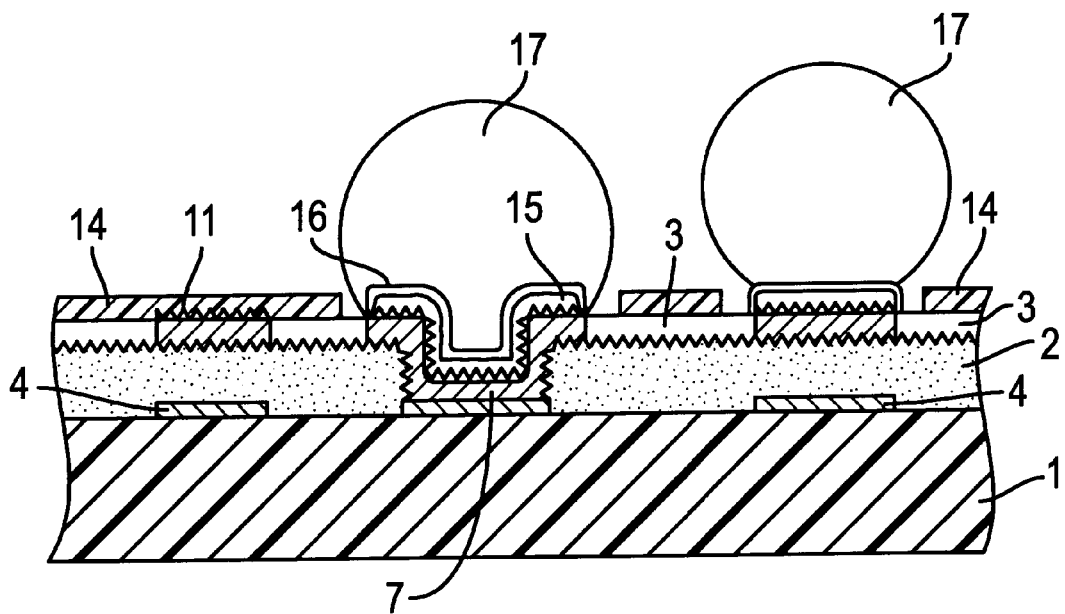
FIG. 3 is a partial section view illustrating a state of forming a solder body in the printed circuit board according to the invention, wherein (a) shows a case in which a full surface of a pad is exposed in an opening portion of the solder resist layer, and (b) shows a case in which a part of a surface of a pad is exposed in an opening portion of the solder resist layer.

In these drawings, numeral 1 is a substrate, numeral 2 an interlaminar insulating resin layer (adhesive layer for electroless plating), numeral 2a an insulating layer, numeral 2b an adhesive layer, numeral 3 a plating resist, numeral 4 an innerlayer conductor circuit (innerlayer copper pattern), numeral 5 an outerlayer conductor circuit (outerlayer copper pattern), numeral 6 an opening for viahole, numeral 7 a viahole (BVH), numeral 8 a copper foil, numeral 9 a through-hole, numeral 10 a filling resin (resin filler), numeral 11 a roughened layer, numeral 12 an electroless copper plated film, numeral 13 an electrolytic copper plated film, numeral 14 a solder resist layer, numeral 15 a nickel plated layer, numeral 16 a gold plated layer, numerals 17, 170 solder bumps (solder body), numeral 18, 180 solder pads (conductor pads) and, numeral 20 a roll coater.

DETAILED DESCRIPTION

The solder resist composition according to the invention lies in a point that it comprises an acrylate of novolac epoxy resin and an imidazole curing agent.

Thus, the solder resist layer formed by curing this composition is excellent in heat resistance and resistance to alkali, and is not degraded even at a melting temperature of a solder (about 200° C.) and is not decomposed by a plating solution such as nickel plating solution or a gold plating solution. Furthermore, the solder resist composition is possible to be developed with a solvent, so that a developed surface is not rough as in the case of alkali developing.

The solder resist composition according to the invention preferably has a viscosity at 25° C. which is adjusted to 0.5–10 Pa·s, more preferably 1–10 Pa·s, more particularly 2–3 Pa·s by using a glycol ether solvent.

The solder resist layer obtained from the solder resist composition having a viscosity at 25° C. adjusted to not less than 0.5 Pa·s is small in the gap between resin molecular chains and the diffusion of Pb moving in the gap (lead migration) becomes small, and hence the short-circuit failure of the printed circuit board is reduced. Further, when the viscosity of the solder resist composition is not less than 0.5 Pa·s at 25° C., even if the composition is simultaneously applied to both surfaces of the substrate at a vertically standing state, good application can be attained without dropping down. However, when the viscosity at 25° C. of the solder resist composition exceeds 10 Pa·s, application by a roll coater can not be conducted, so that the upper limit is 10 Pa·s.

As the acrylate of novolac epoxy resin, there can be used epoxy resin obtained by reacting glycidyl ether of phenol novolac or cresol novolac with acrylic acid or methacrylic acid, and the like.

As the imidazole curing agent, use may be made of available ones, but they are preferably liquid at 25° C. In case of powder, uniform kneading is difficult, while the liquid can be uniformly kneaded.

As such a liquid imidazole curing agent, use may be made of 1-benzyl-2-methyl imidazole (trade name: IB2MZ), 1-cyanoethyl-2-ethyl-4-methyl imidazole (trade name: 2E4MZ-CN), and 4-methyl-2-ethyl imidazole (trade name: 2E4MZ).

The amount of the imidazole curing agent added is preferably 1–10% by weight based on a total solid content of the solder resist composition. When the addition amount is within the above range, uniform mixing is easily conducted.

In the solder resist composition, glycol ether solvent is used as a solvent, so that the solder resist layer made from such a composition does not generate free oxygen nor oxidize the surface of the copper pad. Further, it is less harmful to humans.

As the glycol ether solvent, there are preferably used at least one solvent having the following structural formula, particularly diethylene glycol dimethyl ether (DMDG) and triethylene glycol dimethyl ether (DMTG). Because these solvents can be completely dissolved in benzophenone or Micheler's ketone as a reaction initiator by warming at about 30–50° C.

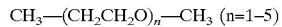

$CH_3$—$(CH_2CH_2O)_n$—$CH_3$ (n=1–5)

The amount of the glycol ether solvent is preferably 10–40% by weight per total weight of the solder resist composition.

The solder resist composition may be added with other additives such as an antifoamer, a leveling agent, a thermosetting resin for improving heat resistance and resistance to base and imparting flexibility, a photosensitive monomer for improving resolution and so on.

Further, a coloring matter and a pigment may be added to the solder resist composition because they can conceal the wiring pattern. As the coloring matter, it is desirable to use phthalocyanine green. Moreover, it is desirable to add inorganic particles made of materials such as silica, alumina and the like and resin particles made of materials such as epoxy resin, polyamide and the like into the solder resist composition so as to lower thermal expansion coefficient.

As the thermosetting resin can be used bisphenol epoxy resin. As the bisphenol epoxy resin, there are bisphenol A epoxy resin and bisphenol F epoxy resin. The former is desirable in case of attaching importance to the resistance to base, while the latter is desirable in case of requiring the decrease of the viscosity (in case of attaching importance to the application property).

As the photosensitive monomer can be used a polyvalent acrylic monomer because the polyvalent acrylic monomer can improve the resolution. For example, it is desirable to use the polyvalent acrylic monomer having the following chemical formulae 1 and 2. In this case, the chemical formula 1 is DPE-6A made by Nippon Kayaku Co., Ltd. and the chemical formula 2 is R-604 made by Kyoei Kagaku Co., Ltd.

(Chemical Formula 1)

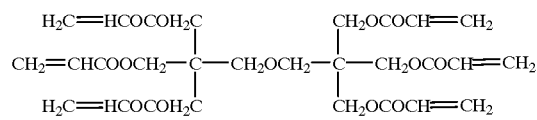

-continued (Chemical Formula 2)

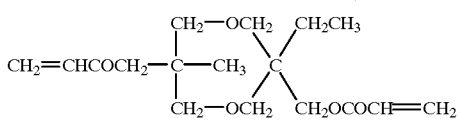

Further, it is desirable to add a polymer of acrylic ester having a molecular weight of about 500–5000 to the solder resist composition. This polymer is liquid at 25° C. and is compatible with acrylate of cresol novolac epoxy resin and has leveling and anti-foaming actions. Therefore, the resulting solder resist layer is excellent in the surface smoothness and does not cause unevenness due to cissing and bubbles.

As the polymer of acrylic ester, it is desirable to use at least one polymer selected from polymers of esters obtained by reacting alcohol having a carbon number of about 1–10 with acrylic acid or methacrylic acid, preferably 2-ethylhexyl acrylate (2EHA), butyl acrylate (BA), ethyl acrylate (EA) and hydroxyethyl acrylate (HEA).

The amount of the polymer of acrylic ester added is preferably 0.1–5 parts by weight per 100 parts by weight of a photosensitive resin component.

Further, benzophenone (BP) and Micheler's ketone (MK) may be added to the solder resist composition as an additional component. They serve as an initiator or a reaction promoter.

It is desirable that BP and MK are uniformly mixed with the other components by simultaneously dissolving them in the glycol ether solvent heated to 30–70° C. because they can be completely dissolved without dissolution residue.

Moreover, it is desirable to use a compound having the following chemical formula 3 as an initiator and a compound having the following chemical formula 4 as a photosensitizer. Because these compounds are easily available and are high in safety to humans.

(Chemical formula 3)

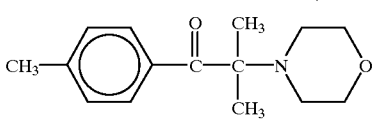

(Chemical formula 4)

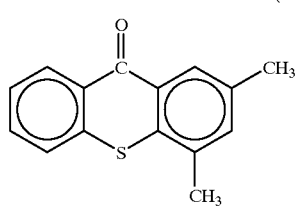

The printed circuit board according to the invention lies in a printed circuit board having a solder resist layer on a surface of a wiring substrate provided with conductor circuits, in which the solder resist layer is formed by curing the aforementioned solder resist composition according to the invention. That is, the solder resist layer is a cured product of a composition comprising an acrylate of novolac epoxy resin and an imidazole curing agent.

However, the solder resist layer is constructed with a resin having a rigid skeleton, so that there may be peeling through heat cycle. On the other hand, even when using a solder resist composition other than the above resin, the resulting solder resist layer has a problem of peeling from the wiring substrate under exposure to high temperature, high humidity and high pressure. In this connection, the printed circuit board according to the invention can prevent the occurrence of peeling by forming the roughening layer on the surface of the conductor circuit.

That is, the printed circuit board according to the invention preferably has a roughened layer which is formed on the surface of the conductor circuit located on an outermost surface layer provided with the solder resist layer.

Thus, the roughened layer formed on the surface of the conductor circuit acts as an anchor to strongly adhere the conductor circuit to the solder resist layer. Therefore, even when a resin having a rigid skeleton such as novolac epoxy resin is used as a resin component of the solder resist layer, interlaminar peeling hardly occurs, so that any resin in addition to the novolac epoxy resin can be used. In the invention, it is particularly desirable to use a composition including novolac epoxy resin or an acrylate of novolac epoxy resin and an imidazole curing agent, more preferably the solder resist composition comprises an acrylate of novolac epoxy resin and an imidazole curing agent and having a viscosity at 25° C. of 1–10 Pa·s adjusted by using glycol ether solvent as a solder resist composition.

It is desirable that the roughened layer is a roughened surface of copper formed by subjecting the surface of the conductor circuit to an etching treatment, a polishing treatment, an oxidation treatment or a redox treatment, or a roughened surface of a plated film formed by subjecting the surface of the conductor circuit to a plating treatment. Among these treatments, the redox treatment preferably involves an oxidation bath (graphitization bath) of NaOH (10 g/l), $NaClO_2$ (40 g/l) and $Na_3PO_4$ (6 g/l) and a reducing bath of NaOH (10 g/l) and $NaBH_4$ (6 g/l), while the plating treatment preferably involves an electroless plating bath for copper-nickel-phosphorus plating at pH=9 comprising 8 g/l of copper sulfate, 0.6 g/l of nickel sulfate, 15 g/l of citric acid, 29 g/l of sodium hypophosphite, 31 g/l of boric acid and 0.1 g/l of a surfactant.

Particularly, the alloy layer formed by copper-nickel-phosphorus plating is a needle-shaped crystal layer and is excellent in adhesion to the solder resist layer, so that it is desired as a roughened layer. This alloy layer is electrically conductive, so that the removal thereof is not necessary even if a solder body is formed on a pad surface. The composition of the alloy layer is preferably 90–96 wt % of copper, 1–5 wt % of nickel and 0.5–2 wt % of phosphorus because the needle-shaped structure is obtained in this composition ratio.

On the other hand, the oxidation treatment of the conductor circuit surface is preferably carried out by using a solution of an oxidizing agent comprising sodium chlorite, sodium hydroxide and sodium phosphate.

Furthermore, the redox treatment of the conductor circuit surface is preferably carried out by immersing a solution of sodium hydroxide and sodium borohydride after the above oxidation treatment.

Moreover, the roughened layer preferably has a thickness of 0.5–10 μm, more preferably 0.5–7 μm. if the thickness is too thick, the roughened layer itself is apt to be peeled, while if it is too thin, the adhesion effect is insufficient. In any case, the adhesion property to the solder resist layer lowers.

Further, the printed circuit board according to the invention preferably involves a part of the conductor circuit exposed from the opening portion of the solder resist layer which is rendered into a pad and a solder body that is fed on the pad, the surface of the pad and/or conductor circuit is an electrically conductive roughened layer and a metal layer having a non-oxidizing metal on at least a surface thereof is formed on the electrically conductive roughened layer arranged on the pad surface exposed from the opening portion and the solder body is strongly held through the metal layer.

It is difficult to closely adhere the solder body onto the roughened layer formed on the pad surface by a transferring method wherein a carrier film provided with a solder pattern is laminated on the surface of the wiring substrate coated with a flux and then transferred thereto by heating, or a printing method wherein a solder cream is printed on the surface of the wiring substrate in a pattern because of the surface tension of the solder. According to the above construction, the solder body is held by the roughened layer through the metal layer of "nickel-gold", "copper-nickel-gold" or the like having a non-oxidizing metal on at least a surface thereof, so that the solder body is closely adhered to the mounting pad even when the formation of the solder body is carried out by a method suitable for mass production such as solder transferring method, solder printing method or the like.

Even in the case of conducting flip chip mounting (the case of directly mounting IC chip), therefore, the solder body is never peeled off from the pad by the difference of thermal expansion coefficient between the surface layer portion of the wiring substrate forming the solder body and the IC chip mounted through the solder body.

Furthermore, the roughened layer is electrically conductive, so that it is not necessary to remove this layer even if the solder body is formed. Therefore, the process is simple.

As the non-oxidizing metal in the above structure, it is desirable to use a noble metal, for example, gold, silver, platinum, palladium or the like because these metals are non-oxidizing and excellent in adhesion to the solder body.

And also, the metal layer having the non-oxidizing metal on at least a surface thereof is preferably arranged in the order of "nickel-gold" or "copper-nickel-gold" from the side close to the pad. Particularly, the metal layer comprised of nickel layer and gold layer preferably has a nickel layer thickness of 1–7 μm and a gold layer thickness of 0.01–0.06 μm.

In the metal layer comprised of nickel layer and gold layer, the nickel layer improves adhesion to roughened layer (for example, needle-shaped copper-nickel-phosphorus alloy layer) located at the side of the pad, while the gold layer improves adhesion to the solder body.

The reason why the thickness of the nickel layer is limited to 1–7 μm is due to the fact that the unevenness of the needle-shaped structure of the roughened layer formed on the side of the pad is mitigated to facilitate the formation of the solder body, while the thickness of the gold layer is controlled so as not to excessively mitigate the needle-shaped structure of the roughened layer.

In the above structure of the printed circuit board according to the invention, it is necessary that the pad holding the solder body is exposed from opening portion formed in the solder resist layer. As the exposing degree, ① that a part of the surface of the pad may be exposed from the opening portion, or ② a full surface of the pad may be exposed from the opening portion.

In form ① in which a part of the pad surface is exposed from the opening in the solder resist layer, the remaining surface part of the pad is covered the solder resist layer. Therefore, the surface of the pad contacting the solder resist layer is liable to be eroded with a basic or acidic plating solution when the surface exposed at the opening portion is subjected to a gold plating.

According to the above construction, the pad and the solder resist layer are strongly adhered to each other through the roughened layer, so that adhesion between the solder resist layer and the pad is not lowered even by immersion in the above plating solution.

In the additive type printed circuit board, the conductor circuit including the pads is formed in non-resist formed portion of the plating resist. Therefore, cracks are liable to be created in an insulating resin layer (adhesive layer for electroless plating) at a boundary portion between the plating resist and the metal pad due to the difference of thermal expansion coefficient therebetween.

In this case, according to the above form ①, the solder resist layer covers the boundary between the plating resist and the metal pad and also the metal pad and the solder resist layer are strongly adhered to each other through the roughened layer, so that the occurrence of cracks can be prevented in the vicinity of the boundary between the metal pad and the plating resist.

In form ② in which the full surface of the pad is exposed from the opening portion in the solder resist layer, the opening portion is larger than the metal pad, and particularly in the case of the additive type printed circuit board, not only the metal pad but also the surrounding thereof are exposed from the opening portion. According to form ①, the resin as the plating resist and the solder resist layer is not wetted to the solder body and repels the solder body, so that flowing out of the solder can be prevented.

Further, the solder resist layer is usually formed by applying and drying a photosensitive resin, placing a photomask film thereon and subjecting light exposure and development treatments. According to form ①, the opening size in the solder resist layer is larger than the diameter of the metal pad, so that the metal pad is hardly covered with the solder resist layer even if the position of the photomask film shifts.

Moreover, according to form ①, the opening size in the solder resist layer is larger than the diameter of the metal pad, so that when a solder body is the solder bump, the constricted portion is not caused in the solder bump because the solder bump does not contact with solder resist layer. As a result, in form ①, the cracks in the solder bump due to the presence of the constricted portion in the solder bump can be prevented.

The printed circuit board according to the invention may involve a printed circuit board wherein a conductor circuit is formed on an insulating layer and a roughened layer is formed on at least a part of the surface of the conductor circuit and the conductor circuit is covered with a solder resist layer (hereinafter referred to as wiring board A) or a printed circuit board wherein a solder pad is formed on an insulating layer and a roughened layer is formed on at least a part of the surface of the solder pad and a solder body is formed through the roughened layer (hereinafter referred to as wiring board B) the conductor circuit or the solder pad is comprised of an electroless plated film and an electrolytic plated film. In this structure, the electrolytic plated film is formed on the side of an outer layer or the side of the solder resist layer or the solder body, while the electroless plated film is formed on the side of the insulating layer.

Thus, the roughened layer on the surface of the conductor circuit or solder pad encroaches into the solder resist layer or the solder body to attain strong adhesion. Further, even when the solder resist layer or the solder body is expanded or shrunk by heat cycle, water absorption or drying, the soft electrolytic plated film follows such deformation, so that peeling of the solder resist layer or the solder body is not caused by heat cycle, water absorption or drying.

Figure 23:
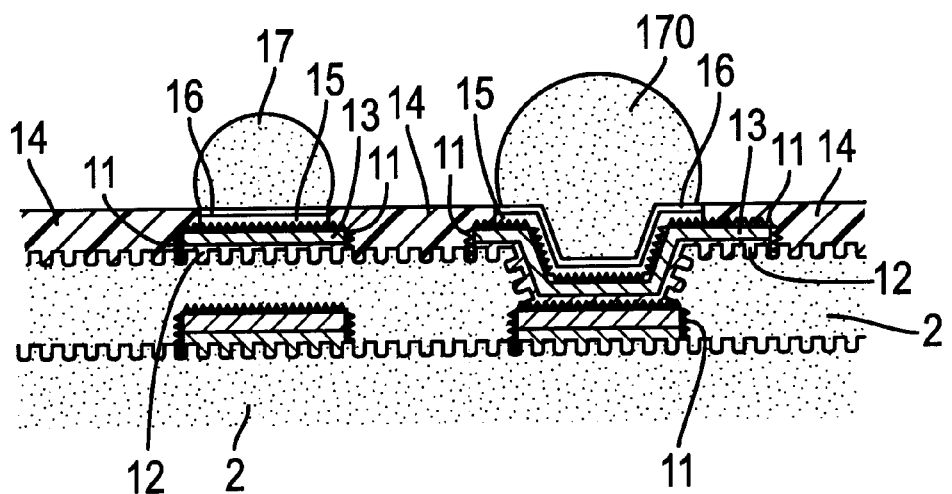
FIGS. 23 and 24 are partially enlarged section views of the printed circuit board according to the invention, respectively.
Figure 24:
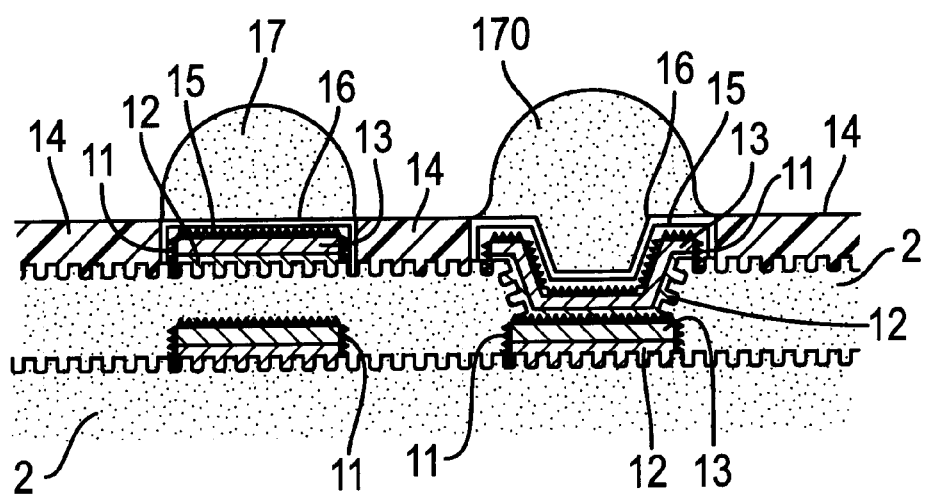
Figure 25:
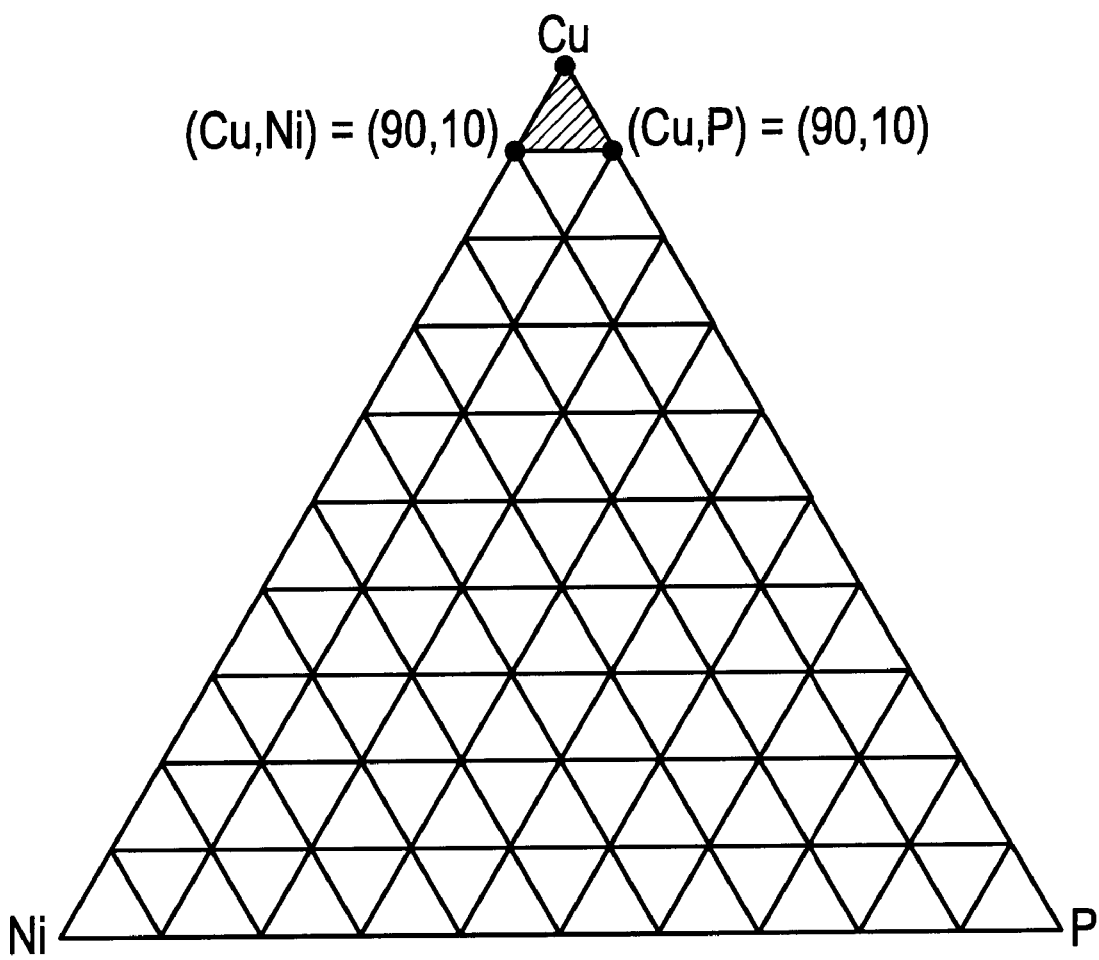
FIG. 25 is a triangular diagram showing a composition of copper-nickel-phosphorus roughened layer.

Even when stress is applied to the solder body, it can be mitigated by the soft electrolytic plated film, while a relatively hard electroless plated film is formed on the side of the insulating layer, so that the conductor circuit or the solder pad is strongly adhered to the insulating layer (see FIGS. 23, 24). As a result, the conductor circuit or the solder pad is not peeled off from the insulating layer. This adhesion is particularly remarkable when the roughened surface is formed on the surface of the insulating resin layer as mentioned later. Because, a hard plated film encroaches into the roughened surface and hence the breakage is hardly caused at the metal side even when a peeling force is applied.

In the wiring board B, the solder body is formed on the metal layer, for example a multi-metal layer arranged in order of "nickel-gold", "copper-nickel-gold" or the like from the innerlayer side in which the metal layer may be adhered to the solder pad through the roughened layer (see FIGS. 23, 24). It is desirable that the thickness of the nickel layer is 0.5–7 $\mu$m and the thickness of the gold layer is 0.01–0.06 $\mu$m.

Figure 20:
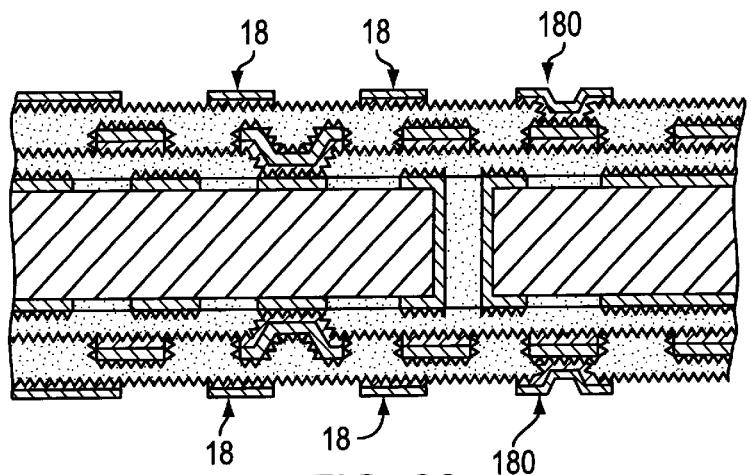

Further, the solder pad may be a flat conductor such as a conductor pad (numeral 18 in FIG. 20) or a viahole (numeral 180 in FIG. 20). In the latter case, the viahole is connected to the innerlayer conductor circuit beneath the insulating layer and the roughened layer is formed on the surface thereof and the solder body is arranged on the roughened layer.

In wiring board B, it is desirable that the solder resist layer is formed on the outermost layer of the board. In this case, the viahole acting as a solder pad can adopt either a form of exposing a part thereof from the solder resist layer (see FIG. 23) or a form of exposing the whole thereof (see FIG. 24). In the former case, the crack created from a side face of the conductor pad or the viahole toward the insulating resin layer can be prevented, while in the latter case, the allowable range of the position shifting of the opening can be made large.

In the wiring boards A, B according to the invention, various resins can be used as a solder resist composition. For example, there can be used resins obtained by curing bisphenol A epoxy resin, acrylate of bisphenol A epoxy resin, novolac epoxy resin, or acrylate of novolac epoxy resin with an amine curing agent, an imidazole curing agent or the like. Particularly, when an opening is formed in the solder resist layer to form a solder bump, it is preferable to use "a resin obtained by curing novolac epoxy resin or acrylate of novolac epoxy resin with an imidazole curing agent."

In the printed circuit board according to the invention as mentioned above, the wiring substrate is not particularly restricted, but it is desirable to be so-called additive printed circuit board or build-up multilayer printed circuit board in which a plating resist is formed on an insulating resin layer having a roughened surface and a conductor circuit including a pad is formed on a portion not forming the plating resist. In case of the above wiring boards A, B, a printed circuit board produced by a semi-additive method is desirable.

In the printed circuit board according to the invention, the solder resist layer preferably has a thickness of 5–40 $\mu$m. If the thickness is too thin, the effect of the solder body as a dam lowers, while if it is too thick, it is difficult to conduct the developing treatment.

Figure 3B:
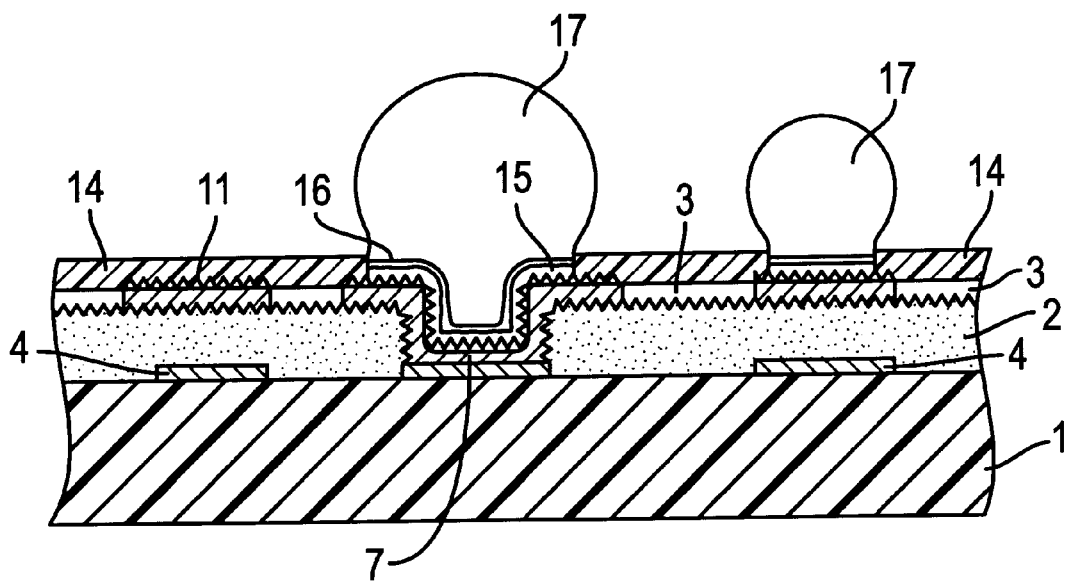

The most suitable structure as the printed circuit board according to the invention is a structure of a printed circuit board comprising a wiring substrate provided with a conductor circuit, a solder resist layer formed on a surface thereof, a pad formed by exposing a part of the conductor circuit from an opening portion in the solder resist layer and a solder body fed and held onto the pad as shown in FIG. 3, in which the solder resist layer is formed by curing the solder resist composition according to the invention and a roughened layer is formed on the surface of the conductor circuit and a metal layer having a non-oxidizing metal on at least a surface thereof is formed on the pad portion constituting a part of the conductor circuit exposed from the opening portion and the solder body is held through the metal layer.

In the printed circuit board of such a structure, the roughened layer formed on the surface of the conductor circuit including the pad (portion mounting IC chip or electronic component) serves as an anchor to strongly adhere the conductor circuit to the solder resist layer. And also, adhesion to the solder body held on the pad surface is improved.

Particularly, the acrylate of novolac epoxy resin is excellent in heat resistance and resistance to base, but is poor in flexibility because of the rigid skeleton, so that peeling is liable to be caused under conditions of high temperature and high humidity. However, according to the above structure of forming the roughened layer on the surface of the conductor circuit, such a peeling can be prevented.

Moreover, the solder body may be layer-like or ball-like or so-called "solder bump".

A method of producing the printed circuit board according to the invention will be described below.

(1) At first, innerlayer copper patterns are formed on a surface of a core substrate to prepare a wiring substrate.

The formation of the copper pattern on the core substrate is carried out by a method of etching a copper-clad laminate or a method wherein an adhesive layer for electroless plating is formed on a substrate such as glass epoxy substrate, polyimide substrate, ceramic substrate, metal substrate or the like and the surface of the adhesive layer is roughened to form a roughened surface and then subjected to an electroless plating.

If further necessary, an adhesive layer for electroless plating is formed on the above printed wiring substrate and an opening for a viahole is formed in the adhesive layer and the surface of the adhesive layer is roughened and an electroless plating is carried out on the roughened surface to form a copper pattern and viahole, and then these steps are repeated to form a multi-layer wiring substrate.

Moreover, through-holes may be formed in the core substrate, so that the wiring layers located on front and rear surfaces may be electrically connected to each other through the through-holes.

(2) Then, an interlaminar insulating resin layer is formed on the wiring substrate prepared in step (1).

Particularly, it is desirable that the adhesive for electroless plating as mentioned above may be used as the interlaminar insulating resin material in the invention. As the adhesive for electroless plating, a product obtained by dispersing cured heat-resistant resin particles soluble in acid or oxidizing agent into an uncured heat-resistant resin hardly soluble in acid or oxidizing agent is optimum.

In the adhesive for electroless plating, the cured heat-resistant resin particles are desirable to be selected from ① heat-resistant resin powder having an average particle size of not more than 10 $\mu$m, ② aggregated particles formed by aggregating heat-resistant resin powder having an average particle size of not more than 2 $\mu$m, ③ a mixture of heat-resistant resin powder having an average particle size of 2–10 $\mu$m and heat-resistant resin powder having an average particle size of not more than 2 $\mu$m, ④ false particles formed by adhering at least one of heat-resistant resin powder and inorganic powder having an average particle size of not more than 2 μm onto surfaces of heat-resistant resin powder having an average particle size of 2–10 μm, and (5) a mixture of heat-resistant resin powder having an average particle size of 0.1–0.8 μm and heat-resistant resin powder having an average particle size of more than 0.8 μm but less than 2 μm because they can form complicated anchor.

(3) After the adhesive layer for electroless plating formed in step (2) is dried, if necessary, an opening portion for viahole is formed. The opening portion for viahole is formed in the adhesive layer by light exposure, development and thermosetting in case of the photosensitive resin, or by thermosetting and laser working in case of the thermosetting resin.

(4) Then, epoxy resin particles existing on the surface of the cured adhesive layer are dissolved and removed by an acid or an oxidizing agent, whereby the surface of the adhesive layer is roughened.

As the acid, there are phosphoric acid, hydrochloric acid, sulfuric acid, or organic acids such as formic acid, acetic acid and the like. Particularly, the use of organic acids is desirable because when the roughening treatment is carried out, the corrosion of the metal conductor circuit exposed from the viahole hardly occurs.

As the oxidizing agent, it is desirable to use chromic acid, permanganate (potassium permanganate or the like) and so on.

(5) Then, a catalyst nucleus is applied to the wiring substrate in which the surface of the adhesive is roughened.

In the application of the catalyst nucleus, it is desirable to use a noble metal ion, a noble metal colloid or the like. in general, palladium chloride or palladium colloid is used. Moreover, it is desirable to conduct a heating treatment for fixing the catalyst nucleus. As the catalyst nucleus, palladium is favorable.

(6) Then, a plating resist is formed on the wiring substrate in which the catalyst nucleus is applied.

As the plating resist, it is desirable to use a composition comprised of an imidazole curing agent and acrylate of cresol novolac epoxy resin, phenol novolac type epoxy resin and the like, but use may be made of commercially available products.

(7) Then, an electroless plating is conducted on the non-resist formed portion to form a conductor circuit including a pad and a viahole, whereby the printed circuit board is produced.

As the electroless plating, it is desirable to use a copper plating.

(8) Then, if necessary, a roughened layer is formed on the surface of the conductor circuit. The formation of the roughened layer can be carried out by etching treatment, polishing treatment, redox treatment, and plating treatment.

Particularly, in the plating treatment, it is desirable to form the roughened layer by depositing a copper-nickel-phosphorus alloy layer through electroless plating.

As the electroless plating of the alloy, it is desirable to use a plating bath having an aqueous solution composition comprising copper sulfate: 1–40 g/l, nickel sulfate: 0.1–6.0 g/l, citric acid: 10–20 g/l, hypophosphite: 10–100 g/l, boric acid: 10–40 g/l and surfactant: 0.01–10 g/l.

(9) Then, a solder resist composition according to the invention is applied onto both surfaces of the printed circuit board treated in step (8).

Particularly, in the invention, when the solder resist layer is applied onto both surfaces of the printed circuit board, it is desirable to apply the solder resist composition onto both surfaces of the substrate at the same time by means of sandwiching the printed circuit board between a pair of rolls in a roll coater at the vertically standing state and carrying to the upper side from the under side as shown in FIG. 2. Because the basic specification of the present printed circuit board is a double-sided board and hence the solder resist composition can not be applied onto both surfaces of the substrate by means of a curtain coat method (a method of flowing a resin from upward to downward as in waterfall and passing the substrate through a "curtain" of the resin). The solder resist composition according to the invention as mentioned above may be used advantageously for the above method which is applied onto both surfaces of the substrate at the same time. The solder resist composition according to the invention has a viscosity of 0.5–10 Pa·s at 25° C., so that there is no outflow and also the transferring is good even if it is applied while vertically standing the substrate.

As shown in FIG. 2, a doctor bar contacting each roll is arranged at a side of an applying face in a roll coater used in the invention. The doctor bar is provided with a receiving portion storing a solder resist composition in a space to the roll. The surface of the roll is made from rubber or a resin such as urethane or the like and many fine grooves are formed on the surface of the resin in a rotating direction of the roll. Therefore, when the rolls are rotated, the solder resist composition stored in the receiving portion enters into the grooves of the roll, and when the composition is contacted with the substrate, it is transferred onto the side of the substrate, whereby the application of the solder resist composition is conducted.

(10) Then, the coating film of the solder resist composition is dried at 60–80° C. for 5–60 minutes, and a photomask film depicted with an opening portion is placed on the dried film, which is subjected to light exposure and developing treatments to form an opening portion exposing a pad portion in the conductor circuit. The film provided with the opening portion is cured by heat treatment at 80–150° C. for 1–10 hours. Thus, the solder resist layer having the opening portion is closely adhered to the roughened layer formed on the surface of the conductor circuit.

The opening size of the opening portion may be made larger than the diameter of the pad to completely expose the pad. in this case, even if the photomask is shifted, the pad is not covered with the solder resist and also the solder resist is not contacted with the solder body, so that a constricted portion is not caused in the solder body and cracks hardly occur in the solder body. on the other hand, the opening size of the opening portion may be made smaller than the diameter of the pad, and in this case the roughened layer on the pad surface is closely adhered to the solder resist.

(11) Then, when the solder body is fed and held onto the pad exposed from the opening portion in the solder resist layer, a metal layer having a non-oxidizing metal on at least a surface thereof such as metal layer of "nickel-gold", metal layer of "copper-nickel-gold" or the like is formed on the pad portion exposed from the opening portion.

As the copper plating, an electroless plating aqueous solution composed of, for example, copper ion, trialkanol amine, reducing agent, pH adjusting agent and water is suitable. Concretely, it is desirable to use an electroless plating aqueous solution having a copper ion concentration of 0.005–0.015 mol/l using copper sulfate or the like as an ion source, a concentration of pH adjusting agent such as sodium hydroxide, potassium hydroxide or the like of 0.25–0.35 mol/l, a concentration of reducing agent such as aldehyde, hypophosphite, hydroborate, hydrazine or the like of 0.01–0.04 mal/l and a concentration of at least one trialkanol amine selected from triethanol amine, triisopropanol amine and tripropanol amine of 0.1–0.8 mol/l.

As the nickel plating or gold plating, there can be used various electroless plating aqueous solutions as described at pages 13–64 and pages 84–87 of "NP Series Electroless Plating" by T. Kanbe (published Sep. 30, 1990).

For example, an electroless nickel plating bath containing 20–40 g/l of nickel chloride, 5–20 g/l of sodium hypophosphite, 40–60 g/l of sodium hydroxyacetate (or 5–20 g/l of sodium citrate) and having pH adjusted to 4–6 at a temperature of 90° C. can be used as the electroless nickel plating.

Furthermore, an electroless gold plating bath containing 1–3 g/l of potassium gold cyanide, 70–80 g/l of ammonium chloride, 40–60 g/l of sodium citrate and 5–20 g/l of sodium hypophosphite and having pH adjusted to 7–7.5 at a temperature of 92–95° C. can be used as the electroless gold plating.

In the invention, when the roughened layer of copper-nickel-phosphorus alloy having a thickness of 0.5–7 $\mu$m is subjected to nickel plating, if the thickness of nickel layer is 1–7 $\mu$m, the roughened layer is substantially filled with the nickel layer to make the surface thereof flat. It is desirable that a gold plated film of 0.01–0.06 $\mu$m in thickness is formed on the flat surface of the nickel layer.

Moreover, it is possible to form a metal layer of 1–7 $\mu$m in thickness on the roughened layer of copper-nickel-phosphorus alloy having a thickness of 0.5–7 $\mu$m by successively conducting the copper plating, nickel plating and gold plating.

(12) Then, a solder body is fed onto the pad exposed from the opening portion.

As the method of feeding the solder body, use may be made of solder transferring method and solder printing method.

The solder transferring method is a method wherein a solder foil is attached to a prepreg and etched so as to leave only a portion corresponding to the opening portion to render into a solder carrier film having a solder pattern, and the solder carrier film is laminated so as to contact the solder pattern with the pad after a flux is applied to the opening portion in the solder resist of the substrate and heated to transfer the solder onto the pad. On the other hand, the solder printing method is a method wherein a metal mask having through-holes corresponding to the pads is placed onto the substrate and a solder paste is printed and heated.

Another method of producing the printed circuit board according to the invention will be described below.

(1) At first, a wiring substrate is prepared by forming an innerlayer copper pattern on a surface of a core substrate.

The copper pattern is formed on the core substrate by a method of etching a copper-clad laminate, or a method of forming an adhesive layer for electroless plating on a substrate such as glass epoxy substrate, polyimide substrate, ceramic substrate, metal substrate or the like and roughening the surface of the adhesive layer and subjecting the roughened surface to an electroless plating, or so-called semi-additive process (the whole of the roughened surface is subjected to an electroless plating and then a plating resist is formed thereon and a portion not forming the plating resist is S subjected to an electrolytic plating and the plating resist is removed and etched to form a conductor circuit comprised of the electrolytic plated film and electroless plated film).

Further, a roughened layer of copper-nickel-phosphorus is formed on the innerlayer copper pattern surface of the wiring substrate.

The roughened layer is formed by electroless plating. The composition of the electroless plating aqueous solution is desirable to have a copper ion concentration of $2.2 \times 10^{-2}$–$4.1 \times 10^{-2}$ mol/l, a nickel ion concentration of $2.2 \times 10^{-3}$–$4.1 \times 10^{-3}$ mol/l and a hypophosphorus acid ion concentration of 0.20–0.25 mol/l.

The film deposited within the above range is needle in crystal structure and is excellent in anchor effect. The electroless plating bath may be added with a complexing agent and additives in addition to the above compounds.

As the other method of forming the roughened layer, there are oxidation-reduction treatment, a method of etching copper surface along grain boundary to form a roughened layer and the like.

Moreover, through-holes are formed in the core substrate, and the front and back wiring layers may be electrically connected to each other through the through-holes.

And also, a resin may be filled in the through-holes and between the conductor circuits of the core substrate to ensure the smoothness thereof (see FIGS. 4–7).

(2) Then, an interlaminar insulating resin layer is formed on the printed wiring substrate prepared in step (1).

Figure 8:
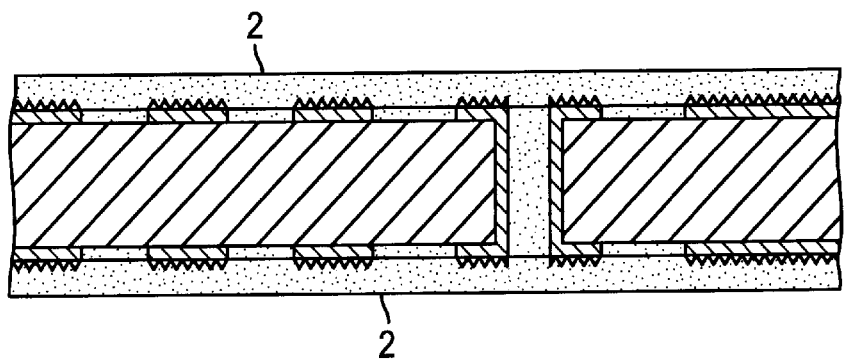

Particularly, it is desirable that the adhesive for electroless plating as mentioned above may be used as the interlaminar insulating resin material in the invention (see FIG. 8).

(3) After the adhesive layer for electroless plating formed in step (2) is dried, if necessary, an opening portion for viahole is formed.

Figure 9:
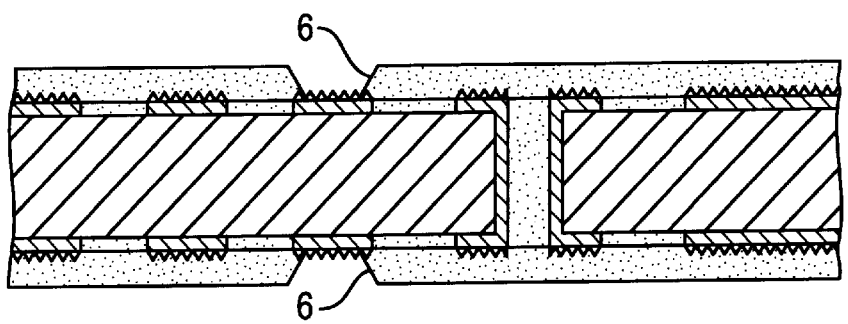

The opening portion for viahole is formed in the adhesive layer by light exposure, development and thermosetting in case of the photosensitive resin, or by thermosetting and laser working in the case of thermosetting resin (see FIG. 9).

Figure 10:
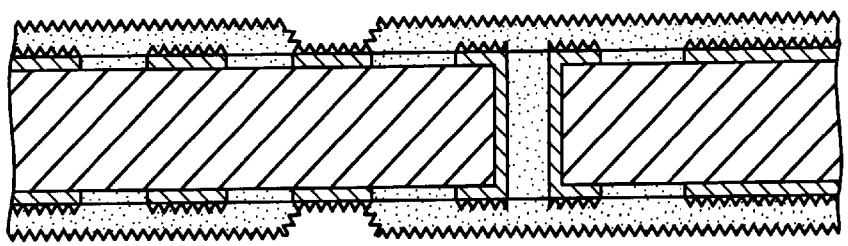

(4) Then, epoxy resin particles existing on the surface of the cured adhesive layer is dissolved and removed with an acid or an oxidizing agent, whereby the surface of the adhesive layer is roughened (see FIG. 10).

As the acid, there are phosphoric acid, hydrochloric acid, sulfuric acid, or organic acids such as formic acid, acetic acid and the like. Particularly, the use of organic acid is desirable because when the roughening treatment is carried out, the corrosion of the metal conductor circuit exposed from the viahole hardly occurs.

As the oxidizing agent, it is desirable to use chromic acid, permanganate (potassium permanganate or the like) and so on.

(5) Then, a catalyst nucleus is applied to the wiring substrate in which the surface of the adhesive is roughened.

In the application of the catalyst nucleus, it is desirable to use a noble metal ion, a noble metal colloid or the like. In general, palladium chloride or palladium colloid is used. moreover, it is desirable to conduct a heating treatment for fixing the catalyst nucleus. As the catalyst nucleus, palladium is favorable.

(6) Then, the surface of the adhesive layer for electroless plating is subjected to an electroless plating to form an electroless plated film on the whole of the roughened surface (see FIG. 11). in this case, the thickness of the electroless plated film is 0.1–5 $\mu$m, more particularly 0.5–3 $\mu$m.

Figure 12:
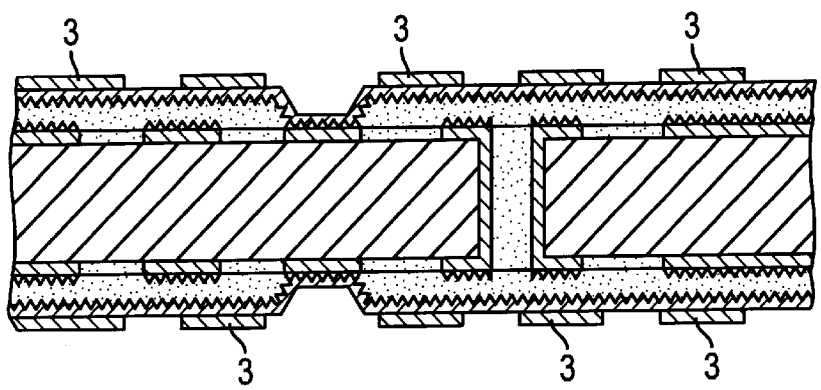

Then, a plating resist is formed on the electroless plated film (see FIG. 12). As the plating resist, it is desirable to use a composition comprised of an imidazole curing agent and acrylate of cresol epoxy resin, phenol novolac epoxy resin and the like, but use may be made of commercially available products.

Figure 13:
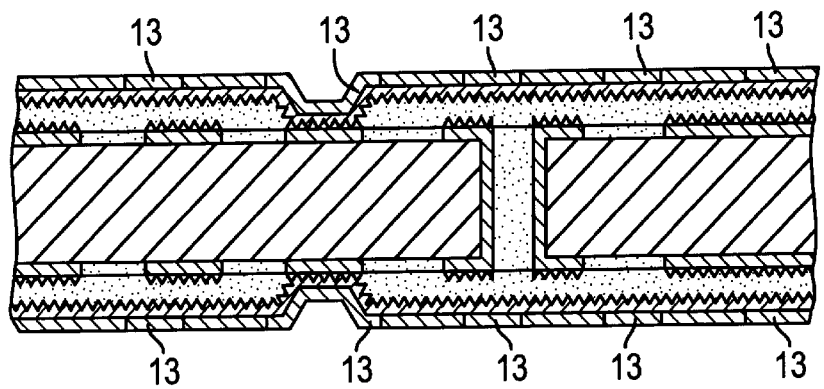

(7) Then, a portion not forming the plating resist is subjected to an electrolytic plating to form conductor circuits and viaholes (see FIG. 13). In this case, it is desirable that the thickness of the electrolytic plated film is 5–30 μm.

As the electrolytic plating, it is desirable to use an electrolytic copper plating.

Figure 14:
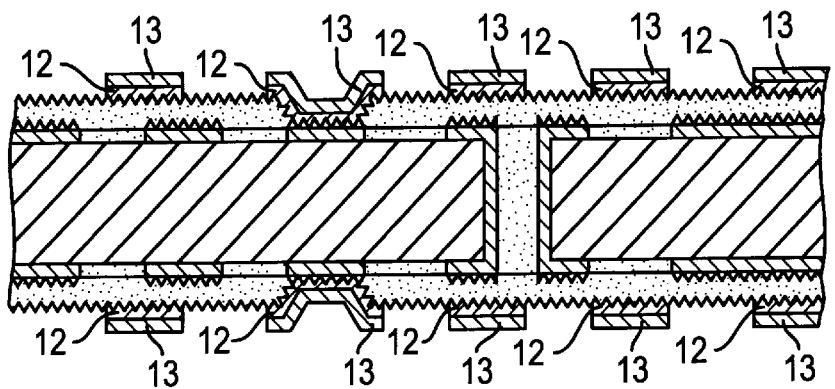

(8) After the plating resist is removed, the electroless plated film beneath the plating resist is removed by dissolving in an etching solution such as a mixture of sulfuric acid and hydrogen peroxide, sodium persulfate, ammonium persulfate or the like to obtain independent conductor circuit (see FIG. 14). Then, the surface of the adhesive layer for electroless plating is etched with an oxidizing agent such as chromic acid or the like to remove the catalyst nucleus remaining thereon.

Figure 15:
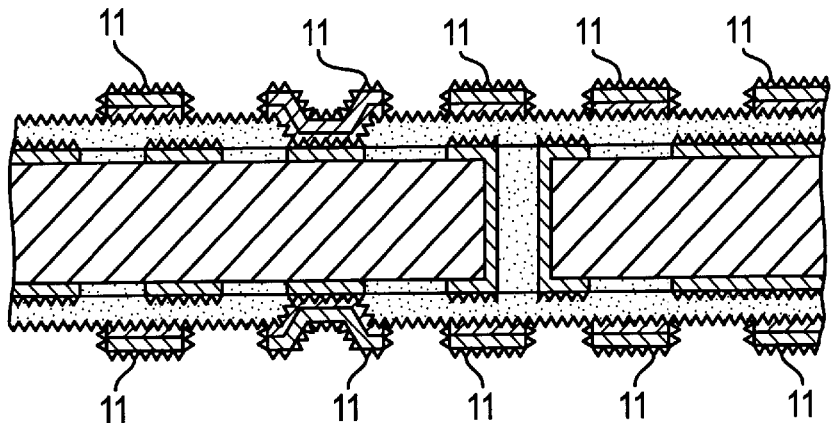

(9) Then, a roughened layer is formed on the surface of the conductor circuit (see FIG. 15).

As the method of forming the roughened layer, there are etching treatment, polishing treatment, redox treatment and plating treatment.

Among them, the redox treatment is conducted by using an oxidation aqueous solution of NaOH (10 g/l), $NaClO_2$ (40 g/l) and $Na_3PO_4$ (6 g/l) and a reduction aqueous solution of NaOH (10 g/l) and $NaBH_4$ (6 g/l).

Furthermore, the roughened layer made from copper-nickel-phosphorus alloy layer is formed through deposition by electroless plating.

Figure 16:
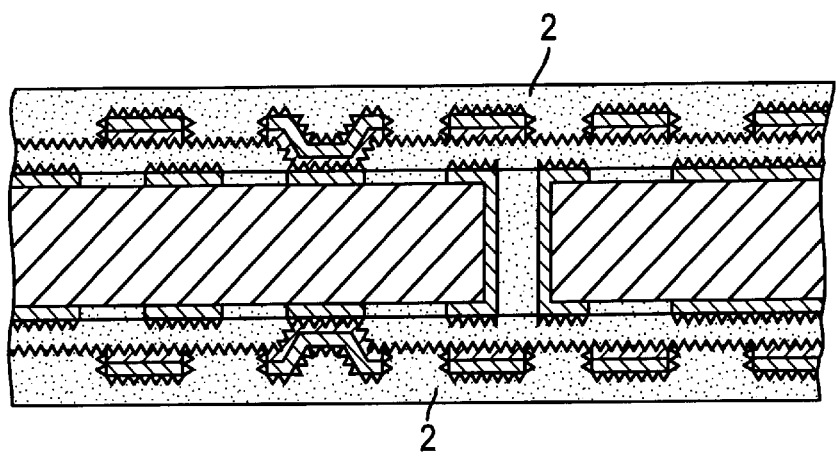
Figure 17:
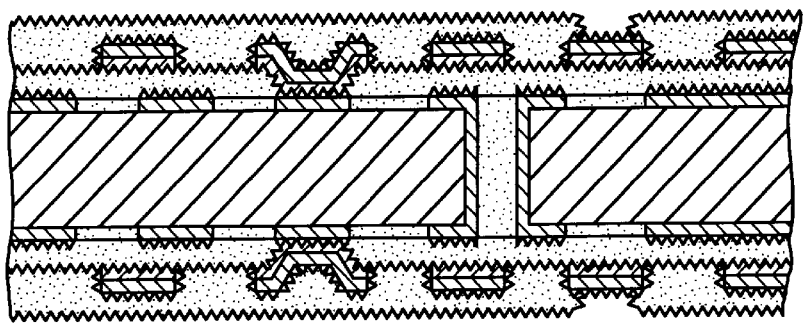
Figure 18:
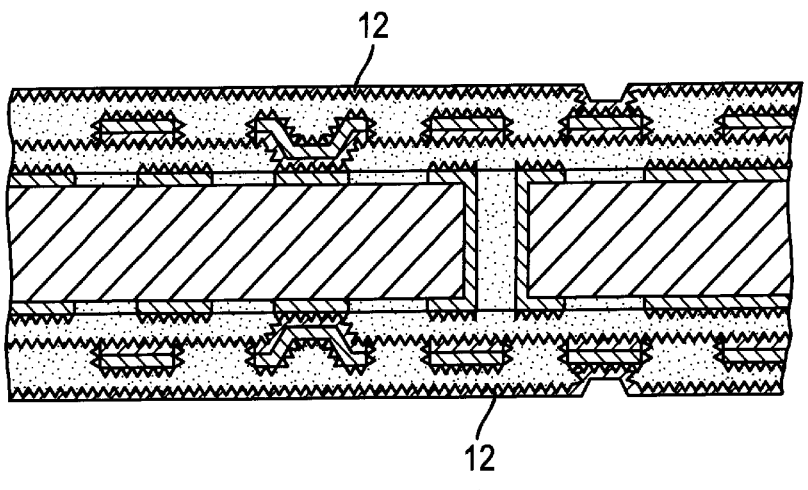
Figure 19:
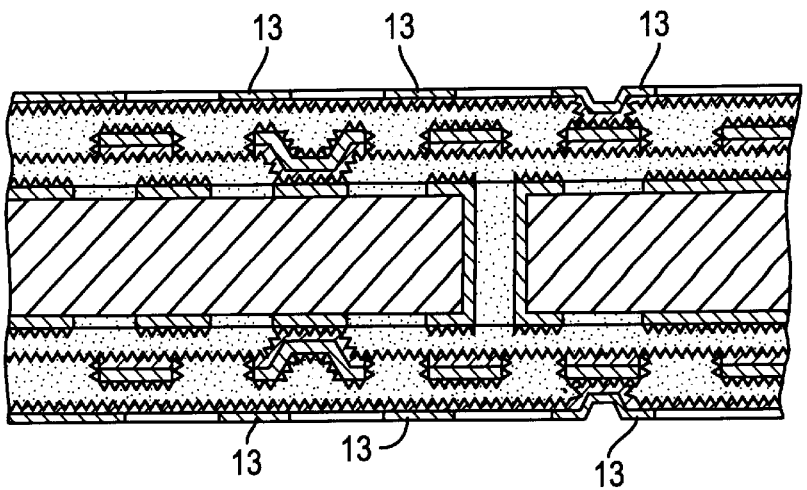

As the electroless alloy plating aqueous solution, it is favorable to use a plating bath of aqueous solution composition comprising copper sulfate: 1–40 g/l, nickel sulfate: 0.1–6.0g/l, citric acid: 10–20 g/l, hypophosphite: 10–100 g/l, boric acid: 10–40 g/l and surfactant: 0.01–10 g/l. (10) An adhesive layer for electroless plating as an interlaminar insulating resin layer is formed on the substrate (see FIG. 16).

(11) Then, an upperlayer conductor circuit is formed by repeating the steps (3)–(8), whereby flat type conductor pad and viahole functioning as a solder pad are formed (see FIGS. 17–20).

Figure 21:
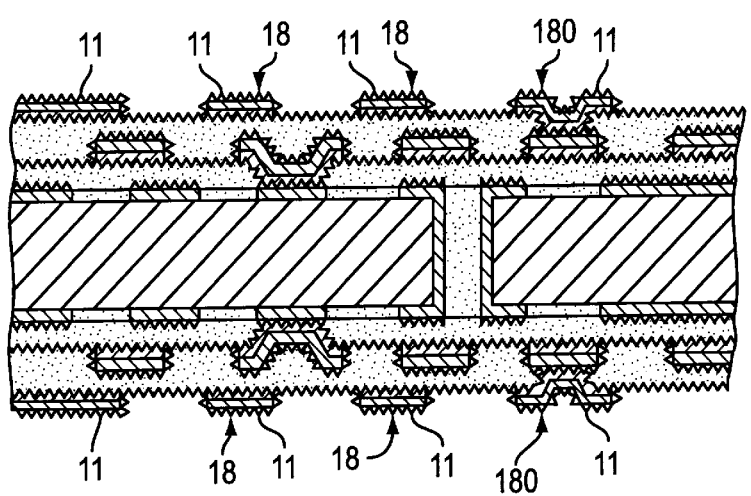

(12) A roughened layer is formed on the surfaces of the conductor pad and viahole (see FIG. 21). The method of forming the roughened layer is the same as in step (9).

(13) Then, a solder resist composition according to the invention is applied onto both surfaces of the printed circuit board treated in step (8).

When the solder resist layer is applied onto both surfaces of the printed circuit board, it is desirable to apply the solder resist composition onto both surfaces of the substrate at the same time by means of sandwiching the printed circuit board between a pair of rolls in a roll coater in a vertically standing state and carrying to the upper side from the under side. Because the basic specification of the present printed circuit board is a double-sided board and hence the solder resist composition can not be applied onto both surfaces of the substrate by means of a curtain coat method (a method of flowing a resin from upward to downward as in waterfall and passing the substrate through a "curtain" of the resin). The solder resist composition according to the invention as mentioned above may be used for the above method which is applied onto both surfaces of the substrate at the same time. That is, the above solder resist composition has a viscosity of 0.5–10 Pa·s at 25° C., so that there is no outflow and also transferring is good even if it is applied while vertically standing the substrate.

(14) Then, the coating film of the solder resist composition is dried at 60–80° C. for 5–60 minutes, and a photomask film depicted with an opening portion is placed on the dried film, which is subjected to light exposure and developing treatments to form an opening portion exposing a pad portion in the conductor circuit. The film provided with the opening portion is cured by a heat treatment at 80–150° C. for 1–10 hours. Thus, the solder resist layer having the opening portion is closely adhered to the roughened layer formed on the surface of the conductor circuit.

The opening size of the opening portion may be made larger than the diameter of the pad to completely expose the pad. In this case, even if the photomask is shifted, the pad is not covered with the solder resist and also the solder resist is not contacted with the solder body, so that a constricted portion is not caused in the solder body and cracks hardly occur in the solder body.

On the other hand, the opening size of the opening portion may be made smaller than the diameter of the pad so as to cover the peripheral edge of the pad with the solder resist. In this case, the roughened layer on the pad surface is closely adhered to the solder resist, so that the pad can be restrained by the solder resist to prevent peeling of the pad. This structure is advantageous in case of adapting so-called semi-additive process that the depth of the roughened layer in the adhesive for electroless plating is shallower (1–3 μm) and the pad is liable to be peeled due to the absence of the plating resist.

(15) Then, a metal layer of "nickel-gold" is formed on the pad portion exposed from the opening portion.

Figure 22:
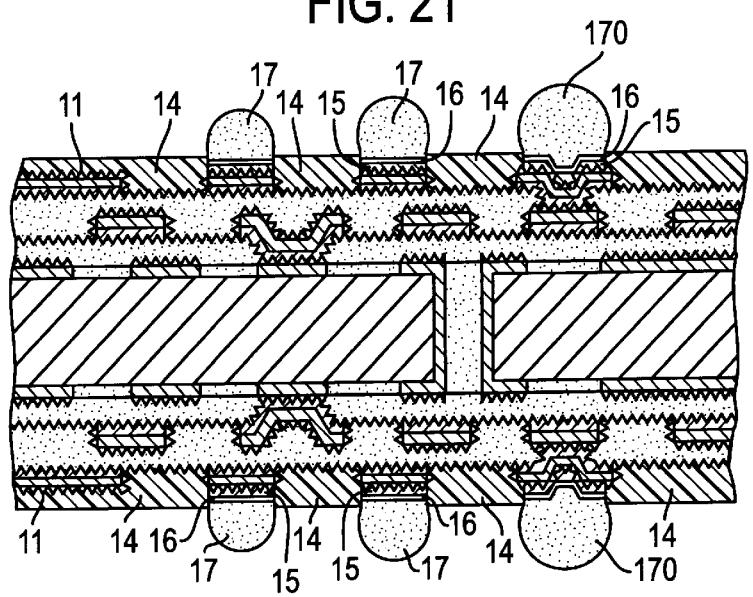

(16) Then, a solder body is fed onto the pad exposed from the opening portion (see FIG. 22).

As the method of feeding the solder body, use may be made of solder transferring method and solder printing method.

The solder transferring method is a method wherein a solder foil is attached to a prepreg and etched so as to leave only a portion corresponding to the opening portion to render into a solder carrier film having a solder pattern, and the solder carrier film is laminated so as to contact the solder pattern with the pad after a flux is applied to the opening portion in the solder resist of the substrate and heated to transfer the solder onto the pad. On the other hand, the solder printing method is a method wherein a metal mask having through-holes corresponding to the pads is placed onto the substrate and a solder paste is printed and heated.

The following examples are given in illustration of the invention and are not intended as limitations thereof.

EXAMPLE 1

(1) As a starting material, there was used a copper-clad laminate obtained by laminating copper foil 8 of 18 μm on both surfaces of a substrate 1 made from glass epoxy resin or BT (bismaleimide triazine) resin having a thickness of 1 mm or 0.6 mm (see FIG. 1(*a*)). The copper foil 8 of the copper-clad laminate was etched in a given pattern according to usual manner to form innerlayer copper patterns 4 on both surfaces of the substrate 1 (see FIG. 1(*b*)).

(2) The substrate provided with the innerlayer copper patterns 4 in step (1) was washed with water, dried and acidically degreased and soft-etched. Then, the substrate was immersed in a catalyst solution of palladium chloride and organic acid to give a Pd catalyst and activated and plated in an electroless plating aqueous solution comprising 8 g/l of copper sulfate, 0.6 g/l of nickel sulfate, 15 g/l of citric acid, 29 g/l of sodium hypophosphite, 31 g/l of boric acid and 0.1 g/l of surfactant and having pH=9 to form a roughened layer (uneven layer) of Cu—Ni—P alloy having a thickness of 2.5 μm on the full surface of copper conductor circuit 4.

Further, the substrate was washed with water and immersed in an electroless tin-substitution plating bath comprising 0.1 mol/l of tin boron fluoride and 1.0 mol/l of thiourea at 50° C. for 1 hour to form a tin-substitution plated layer having a thickness of 0.3 $\mu$m on the surface of the Cu—Ni—P alloy roughened layer.

(3) A photosensitive adhesive solution (interlaminar resin insulating agent) was prepared by mixing 70 parts by weight of 25% acrylated product of cresol novolac epoxy resin (made by Nippon Kayaku Co., Ltd. molecular weight: 2500) dissolved in DMDG (diethylene glycol dimethyl ether), 30 parts by weight of polyether-sulphone (PES), 4 parts by weight of an imidazole[]curing agent (made by Shikoku Kasei Co., Ltd. trade name: 2E4MZ-CN), 10 parts by weight of caprolacton-modified tris (acroxyethyl)isocyanurate (made by Toa Gosei Co., Ltd. trade name: Aranix M32$^5$) as a photosensitive monomer, 5 parts by weight of benzophenone (made by Kanto Kagaku Co., Ltd.) as a photoinitiator, 0.5 parts by weight of Micheler's ketone (made by Kanto Kagaku Co., Ltd.) as a photosensitizer, 35 parts by weight at 5.5 $\mu$m on average and 5 parts by weight at 0.5 $\mu$m on average of epoxy resin particles, adding NMP (normal methylpyrolidone), adjusting a viscosity to 12 Pa·s in a homodisperser agitating machine and kneading them through three rolls.

(4) The photosensitive adhesive solution obtained in step (3) was applied onto both surfaces of the substrate treated in step (2) by means of a roll coater and left to stand at a horizontal state for 20 minutes and dried at 60° C. for 30 minutes to form an adhesive layer 2 having a thickness of 60 $\mu$m.

(5) A photomask film depicted with viaholes was adhered onto each surface of the substrate provided with the adhesive layer 2 in step (4) and exposed by irradiation of ultraviolet ray.

(6) The substrate exposed in step (5) was developed by spraying DMTG (triethylene glycol dimethylether) solution to form openings for viaholes of 100 $\mu$m⌀ in the adhesive layer 2. Further, the substrate was exposed to a superhigh pressure mercury lamp at 3000 mJ/cm$^2$ and then heated at 100° C. for 1 hour and at 150° C. for 5 hours to form an adhesive layer 2 of 50 $\mu$m in thickness having the openings (opening 6 for the formation of viahole). with an excellent size accuracy corresponding to the photomask film. Moreover, the tin plated layer was partially exposed in the opening 6 for the viahole.

(7) The substrate provided with the openings 6 for the viaholes in steps (5), (6) was immersed in chromic acid for 1 minute to dissolve and remove epoxy resin particles from the surface of the adhesive layer, whereby the surface of the adhesive layer was roughened. Thereafter, it was immersed in a neutral solution (made by Shipley) and washed with water.

(8) A palladium catalyst (made by Atotec Co., Ltd.) was applied to the substrate subjected to a roughening treatment (roughening depth: 20 $\mu$m) in step (7) to give a catalyst nucleus to the surface of the adhesive layer 2 and the opening 6 for the viahole.

(9) A mixed solution A was prepared by mixing 46.67 g of a photosensitized oligomer (molecular weight: 4000) obtained by acrylating 50% of epoxy group in 60% by weight of cresol novolac epoxy resin (made by Nippon Kayaku Co., Ltd.) dissolved in DMDG, 15.0 g of 80% by weight of bisphenol A epoxy resin (made by Yuka Shell Co., Ltd. trade name: Epikote 1001) dissolved in methyl ethyl ketone, 1.6 g of an imidazole curing agent (made by Shikoku Kasei Co., Ltd. trade name: 2E4MZ-CN), 3 g of a polyvalent acrylic monomer (made by Nippon Kayaku Co., Ltd. trade name: R604) and 1.5 g of a polyvalent acrylic monomer (made by Kyoeisha Kagaku Co., Ltd. trade name: DPE6A) as a photosensitive monomer.

A mixed solution B was prepared by dissolving 2 g of benzophenone (made by Kanto Kagaku Co., Ltd.) as a photoinitiator and 0.2 g of Micheler's ketone (made by Kanto Kagaku Co., Ltd.) as a photosensitizer in 3 g of DMDG heated at 40° C.

A liquid resist composition was obtained by mixing and agitating the mixed solution A with the mixed solution B.

(10) The liquid resist was applied onto both surfaces of the substrate treated in step (8) by means of a roll coater and dried at 60° C. for 30 minutes to form a resist layer having a thickness of 30 $\mu$m.

(11) A mask depicted with a pattern was laminated onto the resist layer and exposed by irradiation with ultraviolet rays.

(12) The resist layer exposed in step (11) was dissolved and developed with DMDG to form a plating resist 3 removing the conductor circuit pattern on the substrate, which was further exposed to a superhigh pressure mercury lamp at 6000 mJ/cm$^2$. Further, the plating resist 3 was heated at 100° C. for 1 hour and at 150° C. for 3 hours to form a permanent resist 3 on the adhesive layer 2.

(13) The substrate provided with the permanent resist 3 was previously subjected to a preplating treatment (concretely treatment with sulfuric acid or the like and activation of catalyst nucleus) and thereafter subjected to an electroless copper plating in an electroless copper plating bath, whereby electroless plated film having a thickness of 15 $\mu$m was deposited on the no-resist formed portion to form an outerlayer copper pattern 5 and viahole 7. That is, conductor layer was formed through the additive process (see FIG. 1(*d*)).

(14) Then, the substrate provided with the conductor layer was immersed in an electroless plating solution comprising 8 g/l of copper sulfate, 0.6 g/l of nickel sulfate, 15 g/l of citric acid, 29 g/l of sodium hypophosphite, 31 g/l of boric acid and 0.1 g/l of surfactant and having pH=9 to form a roughened layer 11 of copper-nickel-phosphorus on the surface of the conductor layer (see FIG. 1(*e*)).

(15) On the other hand, a solder resist composition was prepared by mixing 46.67 g of a photosensitized oligomer (molecular weight: 4000) obtained by acrylating 50% of epoxy group in 60% by weight of cresol novolac epoxy resin (made by Nippon Kayaku Co., Ltd.) dissolved in DMDG, 15.0 g of 80% by weight of bisphenol A epoxy resin (made by Yuka Shell Co., Ltd. trade name: Epikote 1001) dissolved in methyl ethyl ketone, 1.6 g of an imidazole curing agent (made by Shikoku Kasei Co., Ltd. trade name: 2E4MZ-CN), 3 g of a polyvalent acrylic monomer (made by Nippon Kayaku Co., Ltd. trade name: R604), 1.5 g of a polyvalent acrylic monomer (made by Kyoeisha Kagaku Co., Ltd. trade name: DPE6A) as a photosensitive monomer, 0.71 g of a dispersion defoaming agent (made by Sannopuko Co., Ltd. trade name: S-65), 2 g of benzophenone (made by Kanto Kagaku Co., Ltd.) as a photoinitiator and 0.2 g of Micheler's ketone (made by Kanto Kagaku Co., Ltd.) as a photosensitizer and adjusting a viscosity to 2.0 Pa·s at 25° C.

Moreover, the measurement of the viscosity was carried out by means of a B viscometer (made by Tokyo Keiki Co., Ltd. DVL-B model) with a rotor No. 4 in the case of 60 rpm or a rotor No. 3 in the case of 6 rpm.

(16) The substrate obtained in steps (1)–(14) was sandwiched between a pair of coating roll 21 of the roll coater 20 shown in FIG. 2 at a vertically standing state, and the solder resist composition obtained in step (15) is applied onto the surface of the substrate two times to form a resin layer having a thickness of 20 μm. In this case, the solder resist composition was dried at 75° C. for 20 minutes in the first application and at 75° C. for 30 minutes in the second application.

(17) After the resin layer was formed on the surface of the substrate, it was exposed to ultraviolet ray and developed with DMDG.

Further, the resin layer was heated at 80° C. for 1 hour, at 100° C. for 1 hour, at 120° C. for 1 hour and at 150° C. for 3 hours to form a solder resist layer 14 (thickness: 20 μm) having openings (opening size: 200 μm) in the pad portions (see FIG. 1(f)).

(18) Then, the substrate provided with the solder resist layer 14 was immersed in an electroless nickel plating aqueous solution comprising 30 g/l of nickel chloride, 10 g/l of sodium hypophosphite and 10 g/l of sodium citrate and having pH=5 for 20 minutes to form a nickel plated layer 15 having a thickness of 5 μm on the opening portion. Then, the substrate was immersed in an electroless gold plating aqueous solution comprising 2 g/l of potassium gold cyanide, 75 g/l of ammonium chloride, 50 g/l of sodium citrate and 10 g/l of sodium hypophosphite at 93° C. for 23 minutes to form a gold plated layer 16 having a thickness of 0.03 μm on the nickel plated layer 15 (see FIG. 1(g)).

(19) Then, a solder paste was printed (or may be transferred) on the opening portion of the solder resist layer 14 and reflowed at 200° C. to form a solder bump 17, whereby there was produced a printed circuit board having the solder bumps 17 (FIG. 1(h)).

COMPARATIVE EXAMPLE 1

The steps (1)–(16) were repeated in the same manner as in Example 1 except that 14 g of DMDG was added to the composition in step (15) of Example 1 and the viscosity was adjusted to 0.2 Pa·s as the solder resist composition.

However, the above solder resist composition was too low in viscosity and was easily dropped down, so that it can not simultaneously be applied onto both surfaces of a wiring substrate in a vertically standing state. For this end, such a solder resist was applied to the wiring substrate at a horizontal state through a curtain coat method, whereby the printed circuit board having the solder bumps was produced likewise Example 1.

COMPARATIVE EXAMPLE 2

A printed circuit board having solder bumps was produced in the same manner as in Example 1 except that cresol novolac epoxy resin having a solid content of 70% is used in the solder resist composition of step (15) of Example 1 and the viscosity was adjusted to 15 Pa·s.

In Comparative Example 2, the viscosity of the solder resist composition was too high, so that unevenness was created on the surface of the solder resist layer.

COMPARATIVE EXAMPLE 3

Steps (1)–(16) were repeated in the same manner as in Example 1 except that a composition described in Run No. 1-1 of JP-A-63-286841 (solder resist composition containing orthocresol novolac epoxy resin, cellosolve acetate, benzophenone and Micheler's ketone and having a viscosity of 0.2 Pa·s) was used as a solder resist composition.

However, the above solder resist composition was too low in viscosity and is easily dropped down, so that it can not simultaneously be applied onto both surfaces of the wiring substrate in a vertically standing state. For this end, such a solder resist composition was applied to the surface of the wiring substrate through a curtain coat method described on JP-A-63-286841, and then the printed circuit board having the solder bumps was produced in the same manner as in Example 1.

COMPARATIVE EXAMPLE 4

A printed circuit board having solder bumps was produced in the same manner as in Example 1 except that a composition described in JP-A-62-23036 was used as a solder resist composition and a solder resist layer was developed with an alkali.

With respect to the thus obtained printed circuit boards, HAST test (high acceleration stress test) was conducted to measure the presence or absence of short circuits between the solder bumps by means of a checker. Moreover, test conditions were temperature of 135° C., humidity of 85%, voltage of 3.3 V and 48 hours.

Further, the presence or absence of hallow phenomenon was visually confirmed and also heat cycle test of 1000 times was conducted at −55° C.~125° C. to measure the presence or absence of peeling of the solder resist layer by means of an optical microscope. The results are shown in Table 1.

TABLE I

|  | Application property | HAST test | Hallow phenomenon | Heat cycle test |
|---|---|---|---|---|
| Example 1 | good | no short-circuit | none | no peel |
| Comparative Example 1 | impossibility | short-circuit | none | no peel |
| Comparative Example 2 | uneven surface | no short-circuit | none | no peel |
| Comparative Example 3 | impossibility | short-circuit | presence | peel |
| Comparative Example 4 | good | short-circuit | none | no peel |

In Example 1 according to the invention, when the solder resist composition was applied to the wiring substrate in a vertically standing state by means of a roll coater, the application property was good. On the other hand, the application property of the solder resist composition was poor in Comparative Example 1 having a too low viscosity and Comparative Example 2 having a too high viscosity.

In Example 1, the lead migration was not confirmed and the occurrence of short circuits due to the lead migration was not confirmed after the HAST test. On the contrary, in comparative Examples 2 and 4 using the same solder resist composition as in Example 1, the lead migration was confirmed and the occurrence of short circuits confirmed after the HAST test due to the low viscosity.

Since glycol ether solvent was used in Example 1, oxidation of the conductor circuit, the hallow phenomenon and peeling of the solder resist layer due to heat cycle were not observed. On the contrary, the hallow phenomenon and peeling due to heat cycle was observed in Comparative Example 3 using cellosolve acetate.

EXAMPLE 2

A printed circuit board having solder bumps was produced in the same manner as in Example 1 except that a roughened layer was formed by a redox treatment in step (14) of Example 1. In this redox treatment, an oxidation aqueous solution of $NaClO_2$ (40 g/l) and $Na_3PO_4$ (6 g/l) and a reducing aqueous solution of NaOH (10 g/l) and NaBH₄ (6 g/l) were used.

COMPARATIVE EXAMPLE 5

A printed circuit board having solder bumps was produced in the same manner as in Example 1 except that step (14) of Example 1 (formation of roughened layer) was not carried out and step (18) of Example 1 was under the same condition as in Example 2.

A heat cycle test of 1000 cycles at −55° C.~125° C. was carried out with respect to the printed circuit boards of Examples 1 and 2 and Comparative Example 5 to measure the presence or absence of peeling of the solder resist layer by means of an optical microscope. Further, a PCT test (pressure cooker test) at a temperature of 121° C., a humidity is 100%, a pressure of 2 atmospheric pressure and a time of 200 hours was carried out to visually measure the presence or absence of peeling of the solder resist layer.

The results are shown in Table 2. As seen from Table 2, peeling of the solder resist layer in the heat cycle test or PCT test can be prevented in the printed circuit board according to the invention.

TABLE 2

| | Peeling of solder resist layer | |
|---|---|---|
| | Heat cycle | PCT |
| Example 1 | none | none |
| Example 2 | none | none |
| Comparative Example 5 | presence | presence |

EXAMPLE 3

A printed circuit board having solder bumps was produced in the same manner as in Example 1 except that a copper layer having a thickness of 3 μm was formed by the electroless copper plating of step (13) after the roughening treatment of step (14) of Example 1 and then nickel layer and gold layer were successively formed thereon and thereafter solder bumps were formed by solder transferring method.

Moreover, the solder transferring method involved a method wherein a solder foil was attached to a prepreg by heating under pressure and etched with borofluoric acid to form a solder pattern and then laminated on a substrate coated with flux so as to contact a pad with the solder pattern and heated at 200° C.

COMPARATIVE EXAMPLE 6

A printed circuit board having solder bumps was produced in the same manner as in Example 1 except that the roughening treatment in step (14) was not conducted.

COMPARATIVE EXAMPLE 7

The same procedure as in Example 4 was repeated except that a copper layer was formed on the copper-nickel-phosphorus roughened layer and then solder bumps were formed thereon through solder transferring method without forming the nickel layer and gold layer.

However, in this comparative example, oxide film was formed on the surface of the copper layer by bonding with oxygen in air to degrade wettability to solder. As a result, the solder fed onto the surface of the copper layer becomes spherical on the surface of the copper layer, which was easily dropped off by washing and hence the solder body can not be formed.

With respect to the printed circuit boards of Examples 1 and 3 and Comparative Example 6, a heat cycle test of 1000 cycles at −55° C.~125° C. was carried out to measure the presence or absence of peeling of the solder resist layer by means of an optical microscope.

Further, a heat cycle test of 1000 cycles at −65° C.~125° C. after the mounting of an IC chip consisting of Ga—As was carried out to measure the presence or absence of peeling of the solder bump. In general, after the mounting of the IC chip, the connecting portion between the IC chip and the printed circuit board was sealed with a silicon resin, but in order to remarkably confirm the effect of the invention, the resin sealing was not carried out.

The results are shown in Table 3. As seen from Table 3, peeling of the solder resist layer and peeling of the solder bump in the heat cycle test can be prevented in the printed circuit board according to the invention.

TABLE 3

| | Peeling of solder resist layer | Peeling of solder bump |
|---|---|---|
| Example 1 | none | none |
| Example 3 | none | none |
| Comparative Example 6 | presence | presence |

EXAMPLE 4

Figure 4:
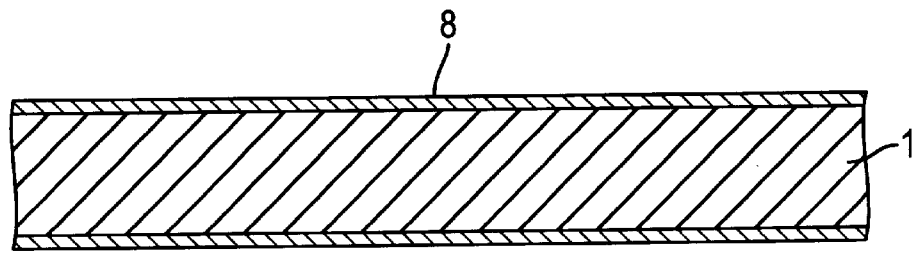
FIGS. 4–22 are flow charts showing production steps of another embodiment of the printed circuit board according to the invention.
Figure 5:
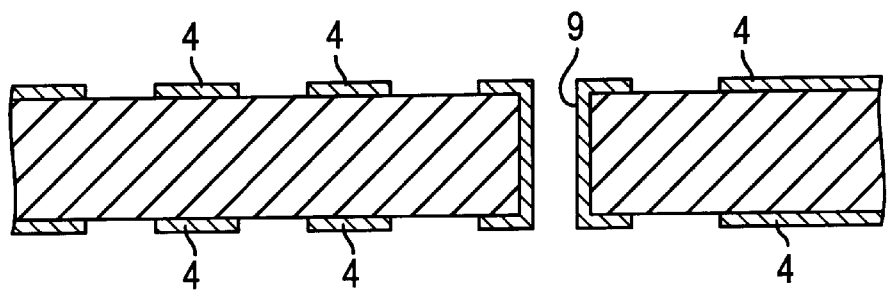

(1) As a starting material, there was used a copper-clad laminate obtained by laminating a copper foil 8 of 18 μm on each surface of a substrate 1 made from a glass epoxy resin or BT (bismaleimide triazine) resin having a thickness of 0.6 mm (see FIG. 4). The copper foil 8 of the copper-clad laminate is etched in a pattern according to the usual manner, which was pierced and subjected to an electroless plating to form innerlayer conductor circuits 4 and through-holes 9 on both surfaces of the substrate (see FIG. 5).

Figure 6:
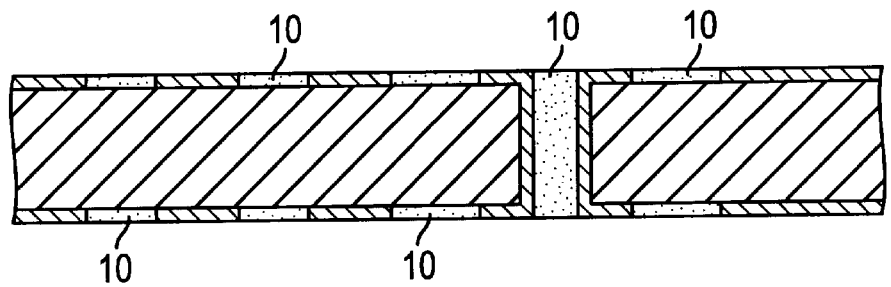
Figure 7:
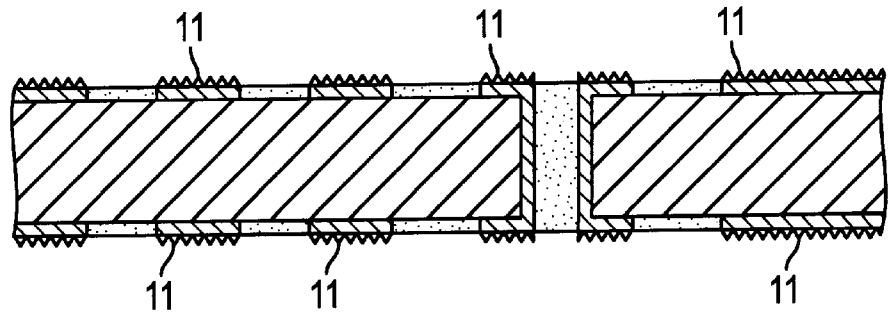

Further, bisphenol F epoxy resin was filled between the innerlayer conductor circuits 4 and in the through-holes 9 (see FIG. 6).

(2) The substrate provided with the innerlayer copper pattern 4 in step (1) was washed with water, dried, acidically degreased and soft-etched. Then, the substrate was treated with a catalyst solution comprising palladium chloride and organic acid to give a Pd catalyst, which was activated and subjected to a plating in an electroless plating bath comprising 8 g/l of copper sulfate, 0.6 g/l of nickel sulfate, 15 g/l of citric acid, 29 g/l of sodium hypophosphite, 31 g/l of boric acid and 0.1 g/l of surfactant and having pH=9 to form a roughened layer 11 (uneven layer) of Cu—Ni—P alloy having a thickness of 2.5 μm on the surface of the copper conductor circuits (see FIG. 7).

(3) A photosensitive adhesive solution (interlaminar resin insulating agent) was prepared by mixing 70 parts by weight of 25% acrylated product of cresol novolac epoxy resin (made by Nippon Kayaku Co., Ltd. molecular weight: 2500) dissolved in DMDG (diethylene glycol dimethyl ether), 30 parts by weight of polyether sulphone (PES), 4 parts by weight of an imidazole curing agent (made by Shikoku Kasei Co., Ltd. trade name: 2E4MZ-CN), 10 parts by weight of caprolacton-modified tris (acroxyethyl) isocyanurate (made by Toa Gosei Co., Ltd. trade name: Aronix M325) as a photosensitive monomer, 5 parts of benzophenone (made by Kanto Kagaku Co., Ltd.) As a photoinitiator, 0.5 parts by weight of Micheler's ketone (made by Kanto Kagaku Co., Ltd.) As a photosensitizer and 35 parts by weight at 5.5 μm on average and 5 parts by weight at 0.5 μm on average of epoxy resin particles, adding NMP (normal methyl pyrolidone), adjusting a viscosity to 12 Pa·s in a homodisperser agitating machine and kneading them through three rolls.

(4) The photosensitive adhesive solution obtained in step (3) was applied onto both surfaces of the substrate treated in step (2) by means of a roll coater and left to stand in a horizontal state for 20 minutes and dried at 60° C. for 30 minutes to form an adhesive layer 2 having a thickness of 60 μm (see FIG. 8).

(5) A photomask film depicted with viaholes was adhered onto each surface of the substrate provided with the adhesive layer 2 in step (4) and exposed by irradiation of ultraviolet ray.

(6) The substrate exposed in step (5) was developed by spraying DMTG (triethylene glycol dimethylether) solution to form openings for viaholes of 100 μmø in the adhesive layer 2. Further, the substrate was exposed to a superhigh pressure mercury lamp at 3000 mJ/cm$^2$ and then heated at 100° C. for 1 hour and at 150° C. for 5 hours to form an adhesive layer 2 of 50 μm in thickness having the openings (opening 6 for the formation of viahole) with an excellent size accuracy corresponding to the photomask film (see FIG. 9). Moreover, the tin plated layer is partially exposed in the opening 6 for the viahole.

(7) The substrate provided with the openings 6 for the viaholes in steps (5), (6) was immersed in chromic acid for 1 minute to dissolve and remove epoxy resin particles from the surface of the adhesive layer, whereby the surface of the adhesive layer was roughened. Thereafter, it was immersed in a neutral solution (made by Shipley) and washed with water (see FIG. 10).

(8) A palladium catalyst (made by Atotec Co., Ltd.) Was applied to the substrate subjected to a roughening treatment (roughening depth: 5 μm) in step (7) to give a catalyst nucleus to the surface of the adhesive layer 2 and the opening 6 for the viahole.

Figure 11:
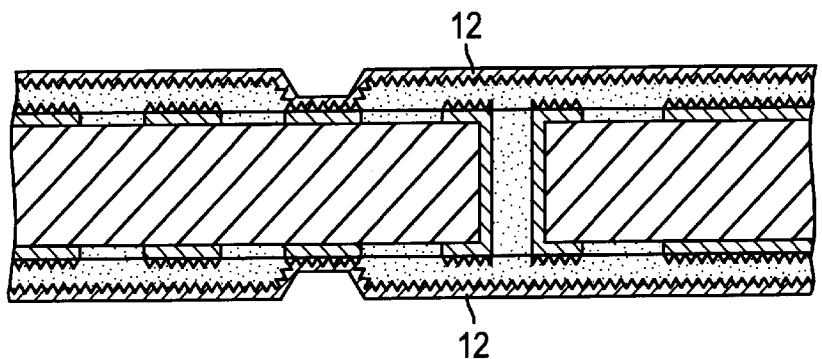

(9) The substrate was immersed in an electroless copper plating bath having the following composition to form an electroless copper plated film 12 having a thickness of 3 μm on the full roughened surface (see FIG. 11).

[Electroless plating aqueous solution]

| | |
|---|---|
| EDTA | 150 g/l |
| Copper sulfate | 20 g/l |
| HCHO | 30 ml/l |
| NaOH | 40 g/l |
| α,α'-bipyridyl | 80 mg/l |
| PEG | 0.1 g/l |

[Electroless plating condition]

liquid temperature of 70° C., 30 minutes

(10) A commercially available photosensitive dry film was attached to the electroless copper plated film 12 formed in step (9) and a photomask film was placed on the dry film, which was exposed to a light at 100 mJ/cm$^2$ and developed with a solution of 0.8% sodium carbonate to form a plating resist 3 having a thickness of 15 μm (see FIG. 12).

(11) Then, the non-resist forming portion was subjected to an electrolytic copper plating under the following conditions to form an electrolytic copper plated film 13 having a thickness of 15 μm (see FIG. 13).

[Electrolytic plating aqueous solution]

| | |
|---|---|
| sulfuric acid | 180 g/l |
| copper sulfate | 80 g/l |
| additive (made by Adotech Japan Co., Ltd. trade name: Kaparashido GL) | 1 ml/l |

[Electrolytic plating condition]

| | |
|---|---|
| current density | 1 A/dm$^2$ |
| time | 30 minutes |
| temperature | room temperature |

(12) After the plating resist 3 was peeled and removed with 5% KOH, the electroless plated film 12 beneath the plating resist 3 was dissolved and removed by etching with a mixed solution of sulfuric acid and hydrogen peroxide to form conductor circuits 5 (including viaholes 7) of 18 μm in thickness comprised of the electroless copper plated film 12 and the electrolytic copper plated film 13 (see FIG. 14).

(13) The substrate provided with the conductor circuits 5 was immersed in an electroless plating aqueous solution comprising 8 g/l of copper sulfate, 0.6 g/l of nickel sulfate, 15 g/l of citric acid, 29 g/l of sodium hypophosphite, 31 g/l of boric acid and 0.1 g/l of surfactant and having pH=9 to form a roughened layer 11 of copper-nickel-phosphorus having a thickness of 3 μm on the surface of the conductor circuit 5 (see FIG. 15). When the roughened layer 11 was analyzed by EPMA (electro probe microanalysis), it had a composition ratio of Cu: 98 mol %, Ni: 1.5 mol % and P: 0.5 mol %.

(14) Steps (4)–(13) were repeated to form a plate-shaped conductor pad 18 and a viahole 180 serving as a solder pad on a further upperlayer and also form a roughened layer 11 on the surfaces thereof (see FIGS. 16–21).

(15) On the other hand, a solder resist composition was prepared by mixing 46.67 parts by weight of a photosensitized oligomer (molecular weight: 4000) obtained by acrylating 50% of epoxy group in cresol novolac epoxy resin (made by Nippon Mayaku Co., Ltd.), 14.121 parts by weight of bisphenol A epoxy resin (made by Yuka Shell Co., Ltd. trade name: Epikote 1001), 1.6 parts by weight of an imidazole curing agent (made by Shikoku Kasei Co., Ltd. trade name: 2E4MZ-CN), 1.5 parts by weight of a polyvalent acrylic monomer (made by Nippon Kayaku Co., Ltd. trade name: R604) as a photosensitive monomer, 3.0 parts by weight of a polyvalent acrylic monomer (made by Kyoeisha Kagaku Co., Ltd. trade name: DPE6A), 0.36 part by weight of a leveling agent (made by Kyoeisha Kagaku Co., Ltd. trade name: Polyflow No. 75), 2.0 parts by weight of Irgaquar I-907 (trade name, made by Ciba Geigey) as a photoinitiator, 0.2 part by weight of DETX-S (trade name, made by Nippon Kayaku Co., Ltd.) as a photosensitizer and 1.0 part by weight of DMDG (diethylene glycol dimethyl ether) and adjusting the viscosity to 1.4±0.3 Pa·s at 25° C.

Moreover, the measurement of the viscosity was carried out by means of a B viscometer (made by Tokyo Keiki Co., Ltd. DVL-B model) with a rotor No. 4 in the case of 60 rpm or a rotor No. 3 in the case of 6 rpm.

(16) The above solder resist composition was applied onto the wiring substrate obtained in step (14) at a thickness of 20 μm. Then, the substrate was dried at 70° C. for 20 minutes and at 70° C. for 30 minutes and a photomask film was placed thereon and then exposed to ultraviolet rays at 1000 mJ/cm² and developed with DMTG. Further, it was heated at 80° C. for 1 hour, at 100° C. for 1 hour, at 120° C. for 1 hour and at 150° C. for 3 hours to form a solder resist layer 14 (thickness: 20 μm) opened in the pad portion (opening size: 200 μm).

(17) The substrate provided with the solder resist layer 14 was immersed in an electroless nickel plating solution of pH=5 comprising 30 g/l of nickel chloride, 10 g/l of sodium hypophosphite and 10 g/l of sodium citrate to form a nickel plated layer 15 having a thickness of 5 μm in the opening portion. Further, the substrate was immersed in an electroless gold plating solution comprising 2 g/l of potassium gold cyanide, 75 g/l of ammonium chloride, 50 g/l of sodium citrate and 10 g/l of sodium hypophosphite at 93° C. for 23 seconds to form a gold plated layer 16 having a thickness of 0.03 μm on the nickel plated layer 15.

(18) A solder paste was printed on the opening portion of the solder resist layer 14 and reflowed at 200° C. to form solder bumps (solder body) 17, 170, whereby there was produced a printed circuit board having solder bumps (see FIG. 22).

EXAMPLE 5

A printed circuit board having solder bumps was produced in the same manner as in Example 4 except that the roughening of the conductor circuit was carried out by etching. In this case, an etching solution of Durabond (trade name, made by Meck Co., Ltd.) was used.

EXAMPLE 6

A. Preparation of an Adhesive Composition for Electroless Plating

①. 35 parts by weight of a resin solution obtained by dissolving 25% acrylated product of cresol novolac epoxy resin (made by Nippon Kayaku Co., Ltd. molecular weight: 2500) in DMDG at a concentration of 80 wt % was mixed with 3.15 parts by weight of a photosensitive monomer (made by Toa Gosei Co., Ltd. trade name: Aronix M315), 0.5 part by weight of a defoaming agent (made by Sannopuko Co., Ltd. trade name: S-65) and 3.6 parts by weight of NMP with stirring.

①. 12 parts by weight of polyether sulphone (PES) was mixed with 7.2 parts by weight at 1.0 μm an average and 3.09 parts by weight at 0.5 μm on average of epoxy resin particles (made by Sanyo Kasei Co., Ltd. trade name: Polymerpole) and further added with 30 parts by weight of NMP and mixed in a beads mill with stirring.

③. 2 parts by weight of an imidazole curing agent (made by Shikoku Kasei Co., Ltd. trade name: 2E-4MZ-CN) was mixed with 2 parts by weight of a photoinitiator (made by Ciba Geigey, trade name: Irgaquar 1-907), 0.2 part by weight of a photosensitizer (made by Nippon Kayaku Co., Ltd. trade name: DETX-S) and 1.5 parts by weight of NMP with stirring.

These mixtures were mixed to prepare an adhesive composition for electroless plating.

B. Preparation of an Underlayer Interlaminar Insulating Resin Material

①. 35 parts by weight of a resin solution obtained by dissolving 25% acrylated product of cresol novolac epoxy resin (made by Nippon Kayaku Co., Ltd. molecular weight: 2500) in DMDG at a concentration of 80 wt % was mixed with 4 parts by weight of a photosensitive monomer (made by Toa Gosei Co., Ltd. trade name: Aranix M315), 0.5 part by weight of a defoaming agent (made by Sannopuko Co., Ltd. trade name: S-65) and 3.6 parts by weight of NMP with stirring.

②. 12 parts by weight of polyether sulphone (PES) was mixed with 14.49 parts by weight at 0.5 μm on average of epoxy resin particles (made by Sanyo Kasei Co., Ltd. trade name: Polymerpole) and further added with 30 parts by weight of NMP and mixed in a beads mill with stirring.

③. 2 parts by weight of an imidazole curing agent (made by Shikoku Kasei Co., Ltd. trade name: 2E-4MZ-CN) was mixed with 2 parts by weight of a photoinitiator (made by Ciba Geigey, trade name: Irgaquar 1-907), 0.2 part by weight of a photosensitizer (made by Nippon Kayaku Co., Ltd. trade name: DETX-S) and 1.5 parts by weight of NMP with stirring.

These mixtures were mixed to prepare a resin composition used as an underlayer side insulating layer constituting the interlaminar insulating resin layer of two-layer structure.

C. C.

Preparation of a Resin Filler

①. 100 parts by weight of bisphenol F epoxy monomer (made by Yuka Shell Co., Ltd. trade name: YL983U, molecular weight: 310), 170 parts by weight of SiO2 spherical particles having an average particle size of 1.6 μm and coated on its surface with a silane coupling agent (made by Adomatic Co., Ltd. trade name: CRS 1101-CE, the maximum size of the particles was not more than the thickness (15 μm) of innerlayer copper pattern as mentioned below) and 1.5 parts by weight of a leveling agent (made by Sannopuko Co., Ltd. trade name: Perenol S4) were kneaded through three rolls and the viscosity thereof was adjusted to 45,000–49,000 cps at 23±1° C.

②. 6.5 parts by weight of an imidazole curing agent (made by Shikoku Kasei Co., Ltd. trade name: 2E4MZ-CN)

They were mixed to prepare a resin filler 10.

D. Production Example 1 for Polymer of Acrylic Ester

In xylene solvent, 2-ethylhexyl acrylate and butyl acrylate were mixed at a weight ratio of 53:47 and copolymerized in a usual manner by heating at 50° C. with the use of dimethylaniline (tertiary amine) as an initiator. Similarly, each of ethylacrylate and hydroxy ethylacrylate was homopolymerized.

Then, copolymer of 2-ethylhexyl acrylate and butyl acrylate, homopolymer of ethylacrylate and homopolymer of hydroxy ethylacrylate were mixed at a weight ratio of 2-ethylhexyl acrylate:butyl acrylate:ethylacrylate:hydroxyethyl acrylate=49:42:6:3 and then xylene was removed by heating.

The thus obtained composition was subjected to reprecipitation conditions in methanol, but the polymer did not settle, and it was presumed that the molecular weight was about 2000–3000.

Figure 46:
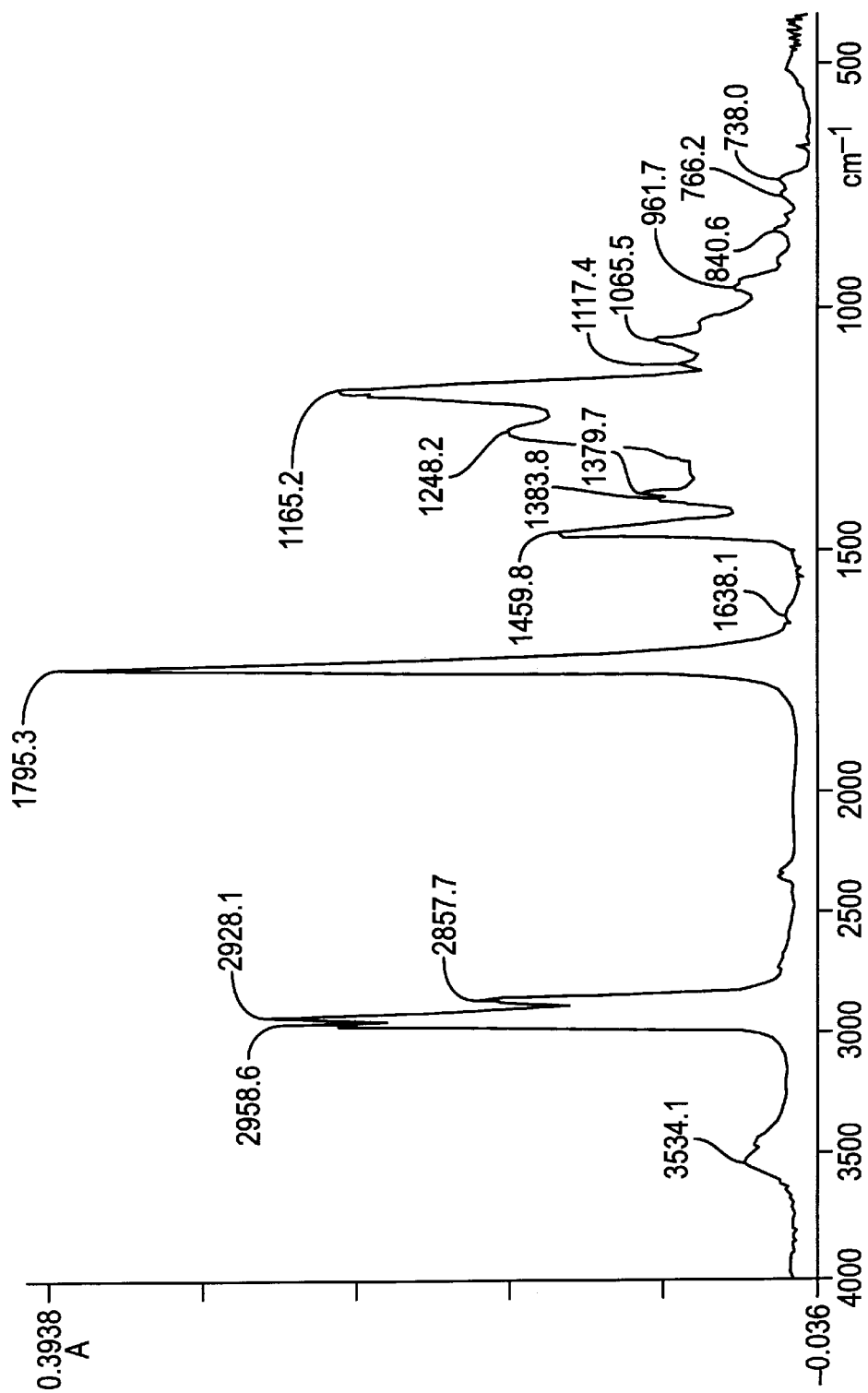
FIG. 46 is a view showing FT-IR spectrum of a polymer of acrylic ester prepared in Example 6.
Figure 47:
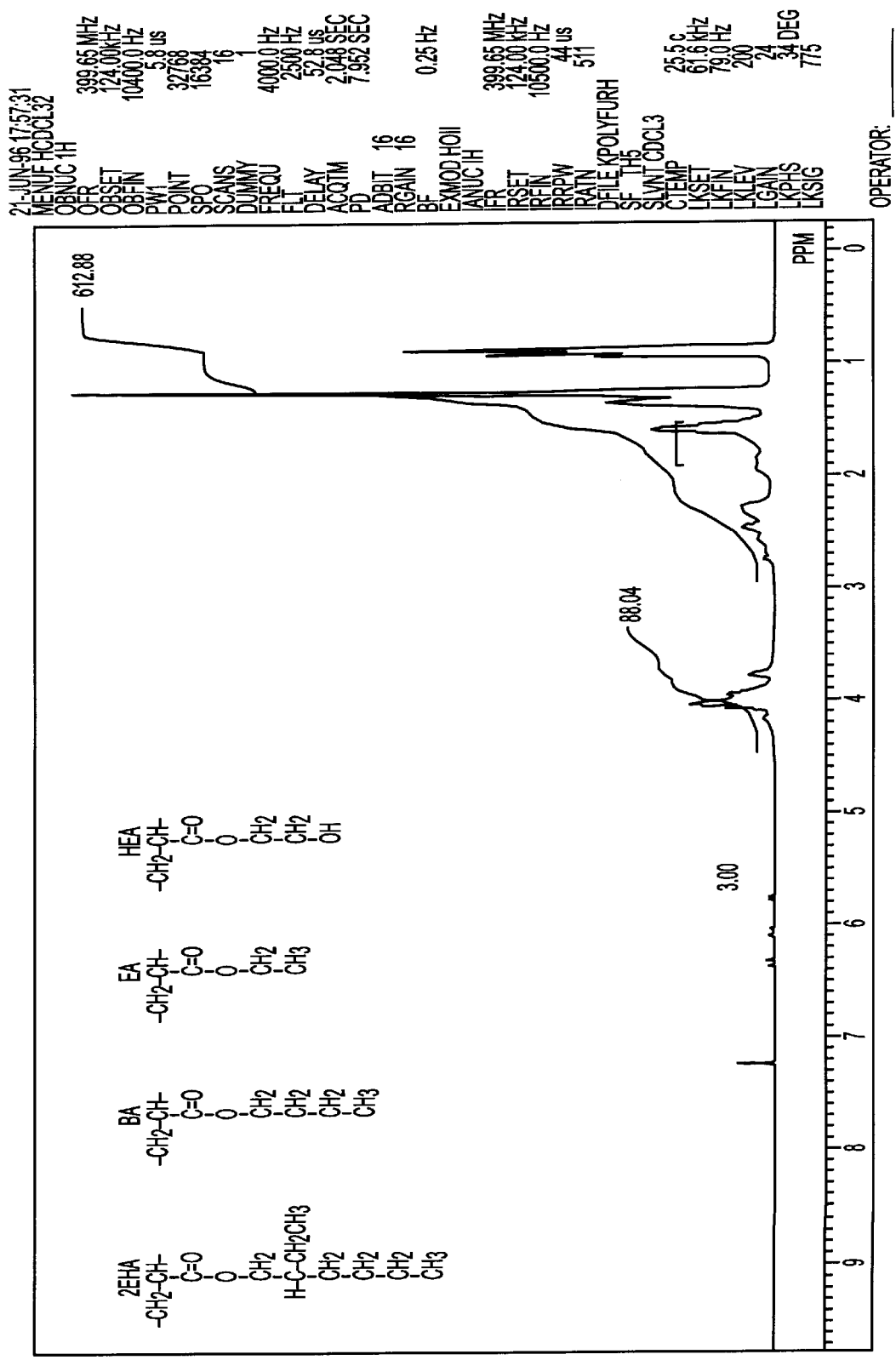
FIG. 47 is a view showing $^1$H-NMR spectrum of a polymer of acrylic ester prepared in Example 6.
Figure 48:
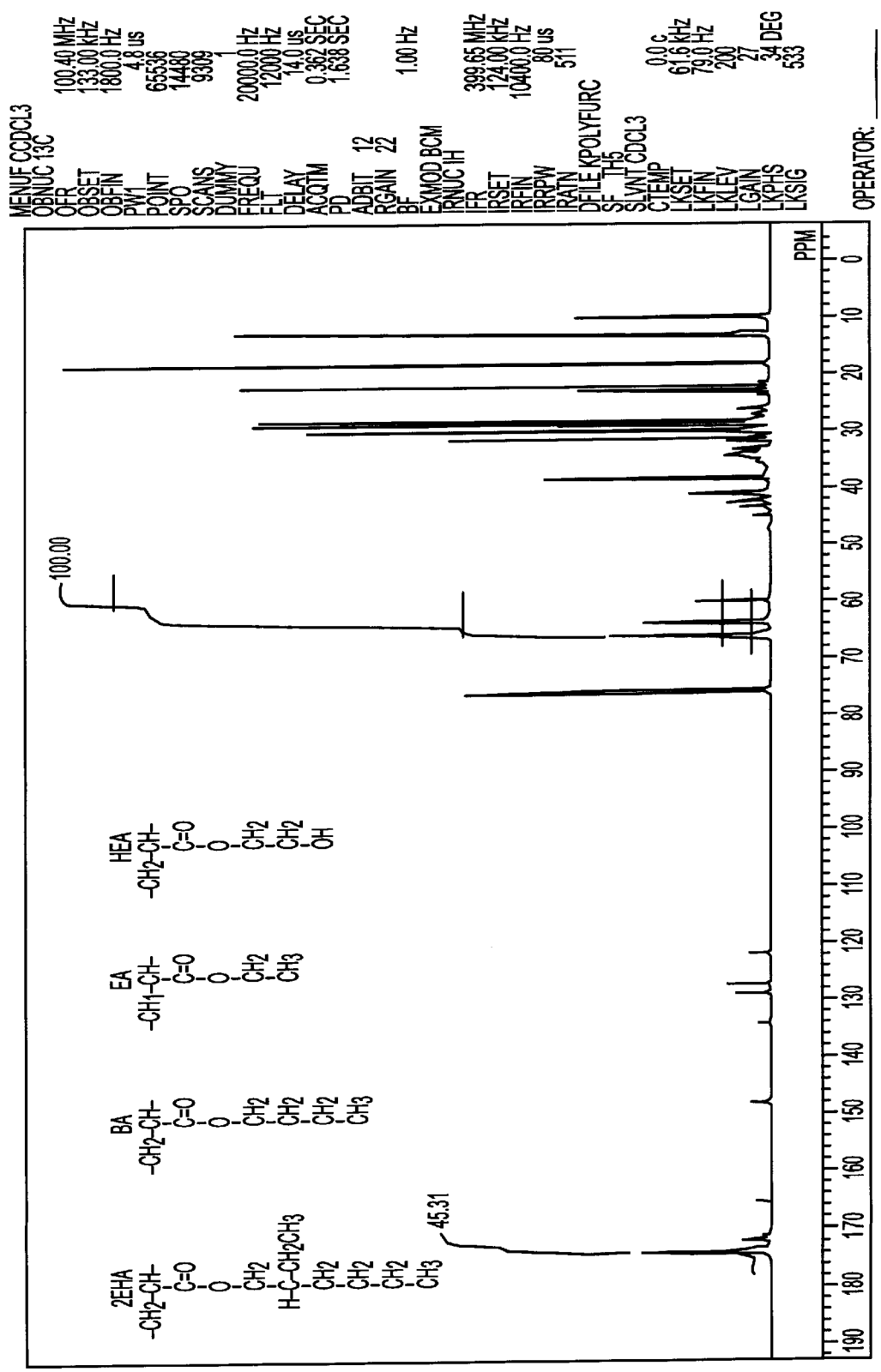
FIG. 48 is a view showing $^{13}$C-NMR spectrum of a polymer of acrylic ester prepared in Example 6.

With respect to the above composition, FT-IR spectrum, ¹H-NMR spectrum and ¹³C-NMR spectrum were measured to obtain results as shown in FIGS. 46, 47 and 48. From the data of these IR and NMR spectra, it was supported that the synthesized product was a polymer of acrylic ester.

[Measuring device and measuring conditions]

① FT-IR device: Perkin Elmer 1650 measuring method: transmitting process (KRS-5)

② NMR device: EX-400 made by Nippon Denshi Co., Ltd.

Observation range:

¹H . . . 400 MHz, pulse width:45°

¹³C . . . 100 MHz, pulse width:45° chemical shift reference: CDCl₃, ¹H 7.25 ppm, ¹³C 77.05 ppm

The measurement was carried out at room temperature after a sample was dissolved in bichloroform and added with 5 droplets of pyridine d5.

Figure 26:
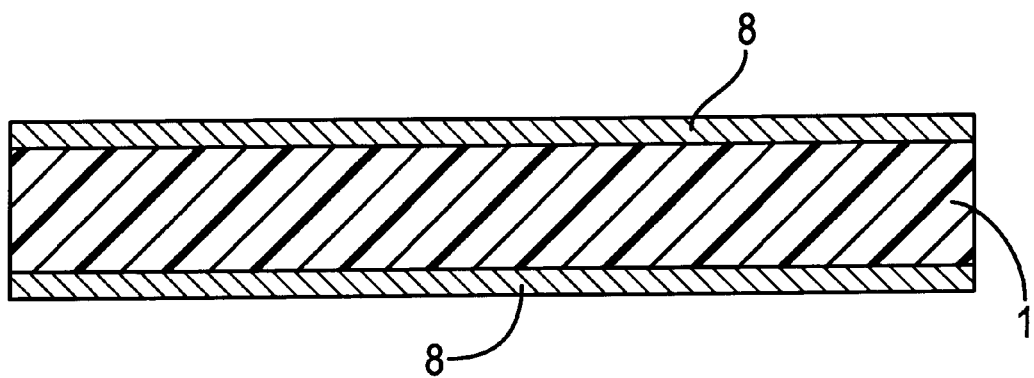

E. Production of Printed Circuit Board (1) As a starting material, there was used a copper-clad laminate formed by laminating a copper foil 8 of 18 μm in thickness onto each surface of a substrate 1 made from glass epoxy resin or BT (bismaleimide triazine) resin and having a thickness of 1 mm (see FIG. 26). At first, the copper-clad laminate was drilled and a plating resist was formed thereon, which was subjected to an electroless plating treatment to form through-holes 9 and further the copper foil 8 was etched in a pattern according to the usual manner to form innerlayer copper patterns 4 on both surfaces of the substrate 1.

Figure 27:
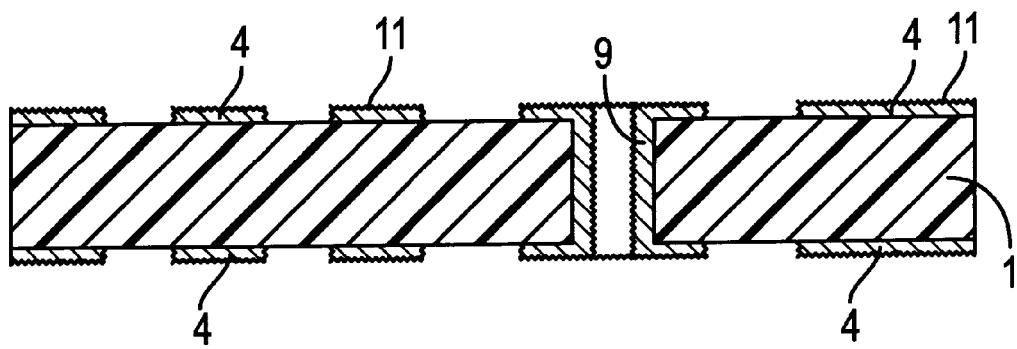

(2) The substrate provided with the innerlayer copper pattern 4 and through-hole 9 was washed with water, dried and subjected to a redox treatment using an oxidizing aqueous solution of NaOH (10 g/l), NaClO$_2$ (40 g/l) and Na$_3$PO$_4$ (6 g/l) and a reducing aqueous solution of NaOH (10 g/l) and NaBH$_4$ (6 g/l) to form a roughened layer 11 on the surfaces of the innerlayer copper pattern 4 and the through-hole 9 (see FIG. 27).

Figure 28:
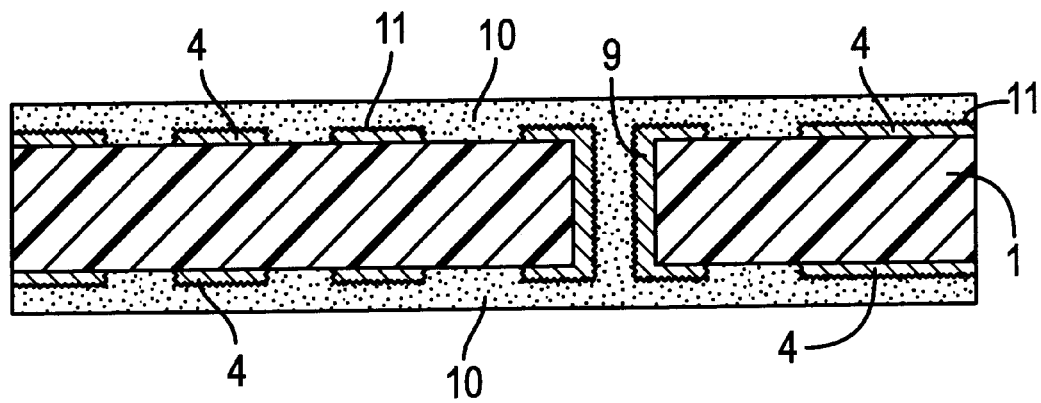

(3) The resin filler 10 was applied onto one-side surface of the substrate by means of a roll coater to fill between the conductor circuits 4 and in the through-holes 9 and dried at 70° C. for 20 minutes. Similarly, the resin filler 10 was filled between the conductor circuits 4 and in the through-hole 9 on the other-side surface and then dried by heating at 70° C. for 20 minutes (see FIG. 28).

(4) The one-side surface of the substrate treated in step (3) was polished by a belt sander polishing using #600 belt polishing paper (made by Sankyo Rikagaku Co., Ltd.) in such a manner that the resin filler is not left on the surface of the innerlayer copper pattern 4 or the land surface of the through-hole 9, and then buff-polished so as to remove scratches formed by the belt sander polishing. Such a series of polishings was applied to the other surface of the substrate.

Then, the substrate was heated at 100° C. for 1 hour, at 120° C. for 3 hours, at 150° C. for 1 hour and at 180° C. for 7 hours to cure the resin filler 10 (see FIG. 29).

Thus, the roughened layer 11 formed on the surface layer portion of the resin filler 10 filled in the through-hole 9 and the like and on the upper surface of the innerlayer conductor circuits 4 was removed to smoothen both surfaces of the substrate, whereby there was obtained a wiring substrate wherein the resin filler 10 was strongly adhered to the side surface of the innerlayer conductor circuit 4 through the roughened layer 11 and the inner wall surface of the through-hole 9 was strongly adhered to the resin filler 10 through the roughened layer 11. That is, the surface of the resin filler 10 and the surface of the innerlayer copper pattern 4 are the same plane in this step. In this case, the curing resin filled has a Tg point of 155.6° C. and a linear thermal expansion coefficient of 44.5×10$^{-6}$/° C.

(5) A roughened layer (uneven layer) 11 of Cu—Ni—P alloy having a thickness of 2.5 μm was formed on the exposed surfaces of the innerlayer conductor circuit 4 and the land of the through-hole 9 in step (4) and further a Sn layer having a thickness of 0.3 μm was formed on the surface of the roughened layer 11 (see FIG. 30, provided that the Sn layer was not shown).

The formation method was as follows. That is, the substrate is acidically degreased and soft-etched and treated with a catalyst solution of palladium chloride and organic acid to give Pd catalyst, which was activated and subjected to a plating in an electroless plating bath of pH=9 comprising 8 g/l of copper sulfate, 0.6 g/l of nickel sulfate, 15 g/l of citric acid, 29 g/l of sodium hypophosphite, 31 g/l of boric acid, 0.1 g/l of surfactant and water to form the roughened layer 11 of Cu—Ni—P alloy on the upper surfaces of the copper conductor circuit 4 and land of through-hole 9. Then, Cu—Sn substitution reaction was carried out by immersing in a solution containing 0.1 mol/l of tin borofluoride and 1.0 mol/l of thiourea at a temperature of 50° C. and pH=1.2 to form the Sn layer of 0.3 μm on the surface of the roughened layer 11 (Sn layer is not shown).

(6) The interlaminar insulating resin material of item B (viscosity: 1.5 Pa·s) was applied onto both surfaces of the substrate treated in step (5) by means of a roll coater and left to stand in a horizontal state for 20 minutes and dried at 60° C. for 30 minutes (pre-baking) to form an insulating layer 2a.

Figure 31:
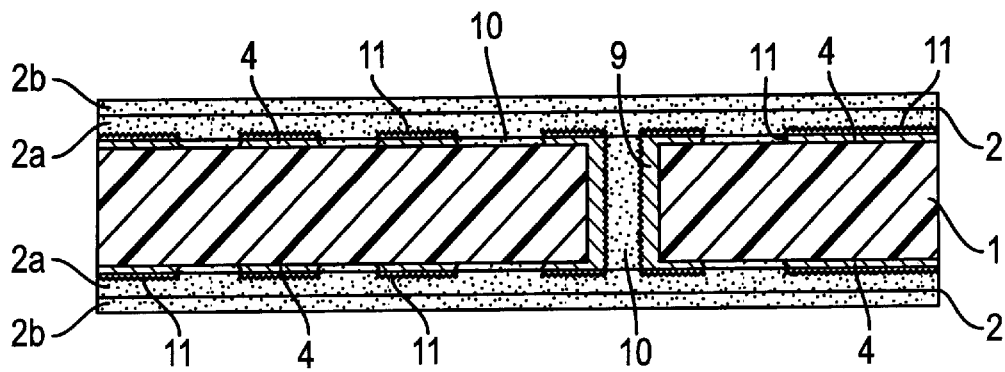

Further, the adhesive for electroless plating of item A (viscosity: 7 Pa·s) was applied onto the insulating layer 2a by means of a roll coater and left to stand in a horizontal state for 20 minutes and dried at 60° C. for 30 minutes (pre-baking) to form an adhesive layer 2b (see FIG. 31).

Figure 32:
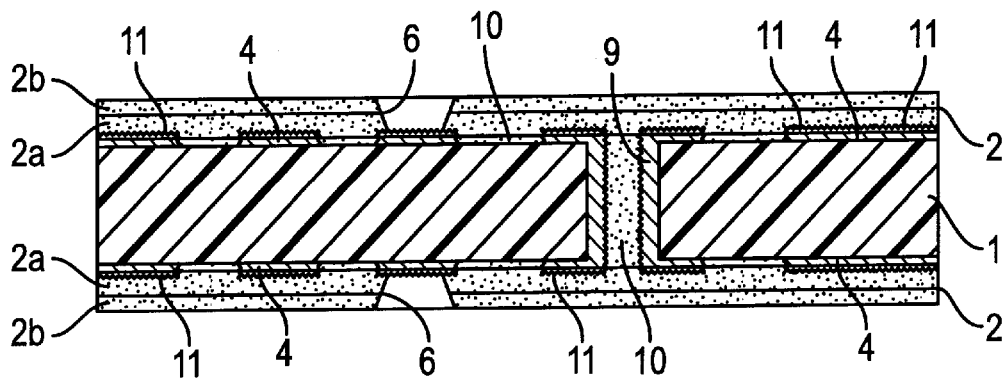

(7) A photomask film depicted with black circles of 85 μm in diameter was closely adhered onto both surfaces of the substrate provided with the insulating layer 2a and adhesive layer 2b in step (6) and exposed to a superhigh pressure mercury lamp at 500 mJ/cm$^2$. It was developed by spraying DMTG solution and further exposed to a superhigh pressure mercury lamp at 3000 mJ/cm$^2$ and heated at 100° C. for 1 hour and at 150° C. for 5 hours (post baking) to form an interlaminar insulating resin layer (two-layer structure) of 35 μm in thickness having openings of 85 μm in diameter (openings 6 for the formation of viaholes) with an excellent size accuracy corresponding to the photomask film (see FIG. 32). Moreover, the tin plated layer was partially exposed in the opening for viahole.

Figure 33:
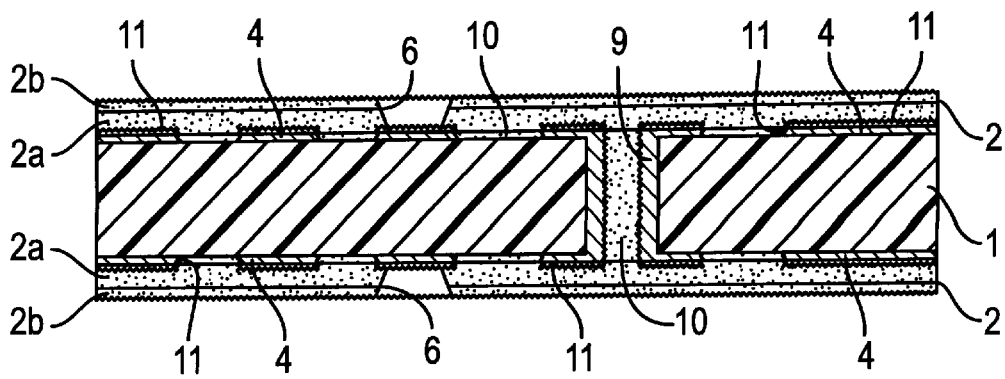

(8) The substrate provided with the opening was immersed in 800 g/l of chromic acid at 70° C. for 19 minutes to dissolve and remove the epoxy resin particles existing on the surface of the adhesive layer 2b in the interlaminar insulating resin layer 2, whereby the surface of the interlaminar insulating resin layer 2 was roughened (depth: 3 μm) and thereafter the substrate was immersed in a neutral solution (made by Shipley) and washed with water (see FIG. 33).

Further, a palladium catalyst (made by Atotec Co., Ltd.) was applied to the roughened surface of the substrate to give a catalyst nucleus to the surface of the interlaminar insulating resin layer 2 and the inner wall surface of the opening 6 for viahole.

Figure 34:
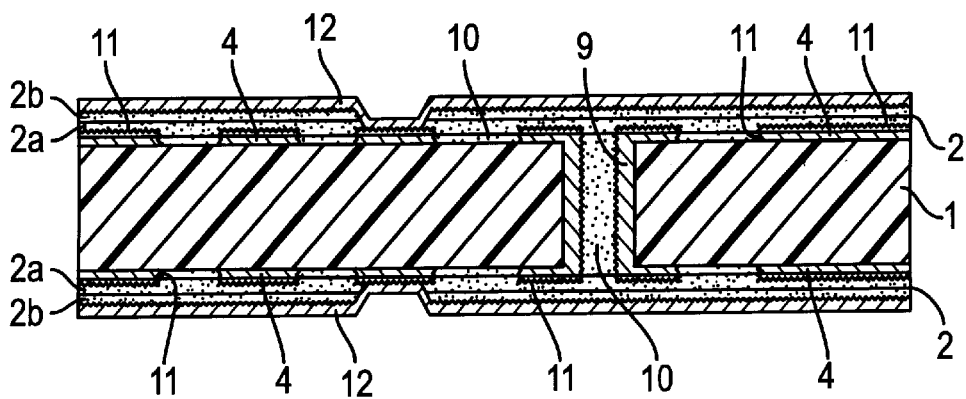

(9) The substrate was immersed in an electroless copper plating bath having the following composition to form an electroless copper plated film 12 having a thickness of 0.6 μm on the full roughened surface (see FIG. 34).

| [Electroless plating aqueous solution] | |
|---|---|
| EDTA | 150 g/l |
| Copper sulfate | 20 g/l |
| HCHO | 30 ml/l |
| NaOH | 40 g/l |
| α,α'-bipyridyl | 80 mg/l |
| PEG | 0.1 g/l |

-continued

[Electroless plating condition]

liquid temperature of 70° C., 30 minutes

Figure 35:
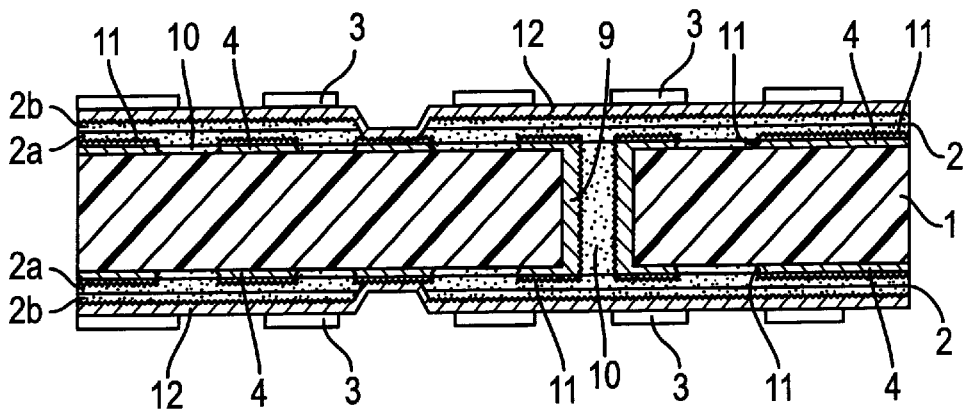

(10) A commercially available photosensitive dry film was adhered to the electroless copper plated film 12 formed in step (9) and a mask was placed thereon and exposed to a light at 100 mJ/cm$^2$ and developed with 0.8% of sodium carbonate to form a plating resist 3 having a thickness of 15 μm (see FIG. 35).

Figure 36:
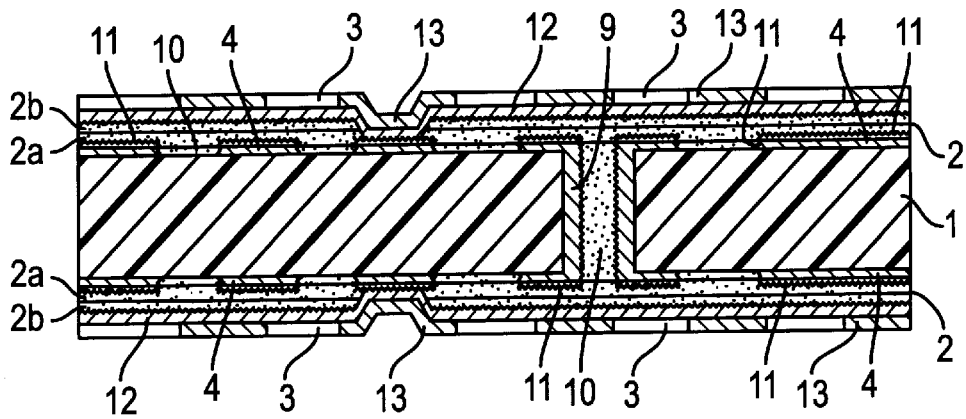

(11) Then, the non-resist forming portion was subjected to an electrolytic copper plating under the following conditions to form an electrolytic copper plated film 13 having a thickness of 15 μm (see FIG. 36).

[Electrolytic plating aqueous solution]

| | |
|---|---|
| sulfuric acid | 180 g/l |
| copper sulfate | 80 g/l |
| Additive (made by Adotech Japan trade name: Capalacid GL) | 1 ml/l |

[Electrolytic plating condition]

| | |
|---|---|
| current density | 1 A/dm$^2$ |
| time | 30 minutes |
| temperature | Room temperature |

Figure 37:
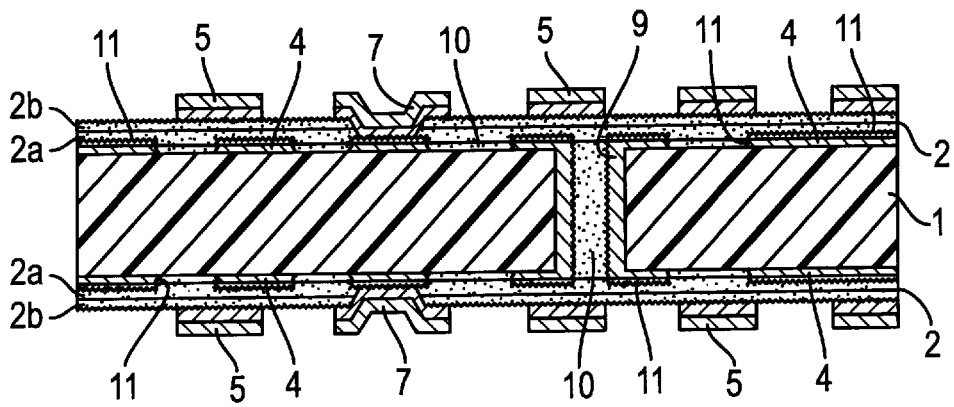

(12) After the plating resist 3 was peeled off with 5% KOH, the electroless plated film 12 beneath the plating resist 3 was dissolved and removed by etching with a mixed solution of sulfuric acid and hydrogen peroxide to form conductor circuit 5 (including viahole) of 18 μm in thickness comprised of the electroless copper plated film 12 and the electrolytic copper plated film 13. Further, it was immersed in 800 g/l of chromic acid at 70° C. for 3 minutes to etch the surface of the adhesive layer for electroless plating between conductor circuits located at the portion not forming the conductor circuit by 1–2 μm to thereby remove the palladium catalyst remaining on the surface (see FIG. 37).

Figure 38:
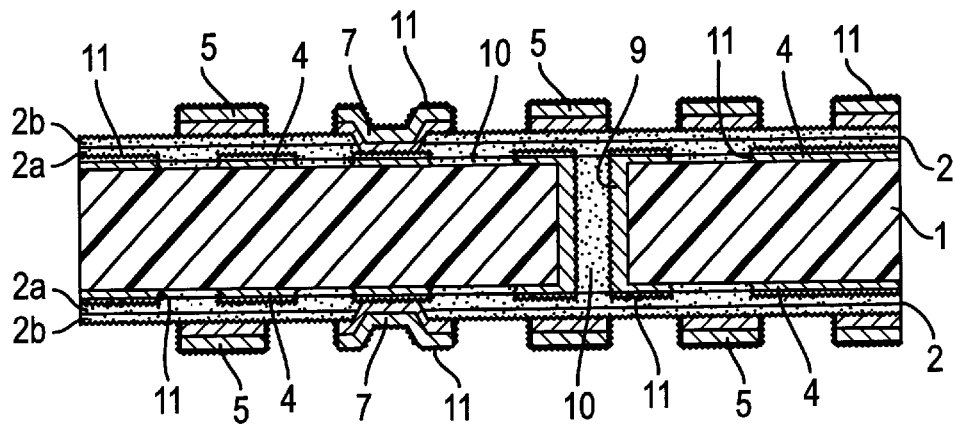
Figure 39:
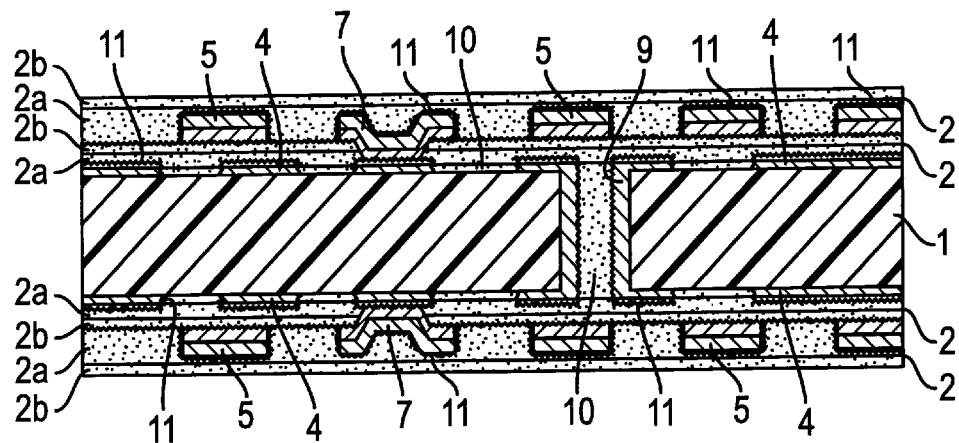
Figure 40:
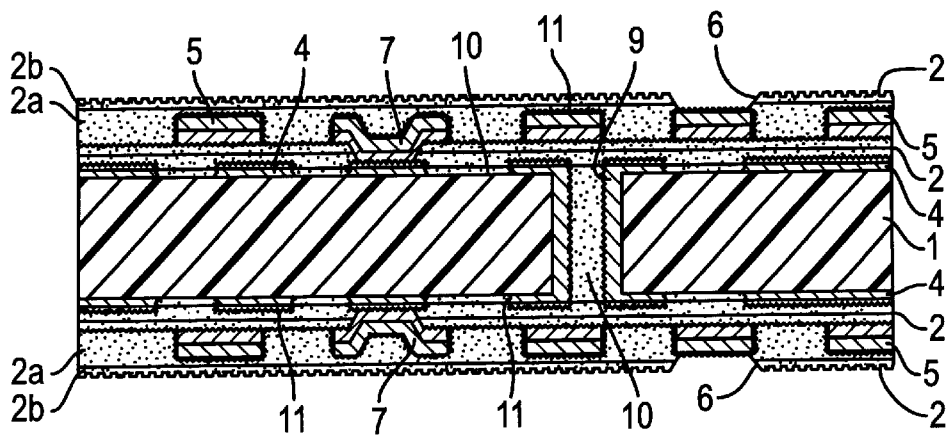
Figure 41:
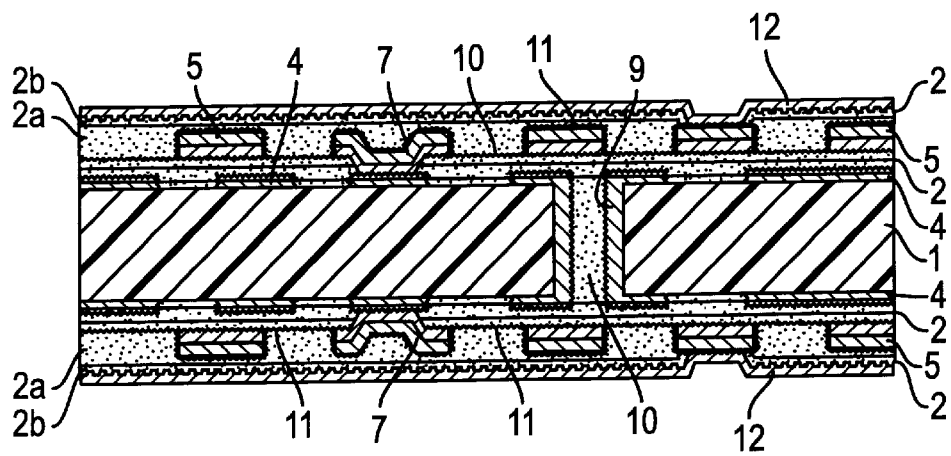
Figure 42:
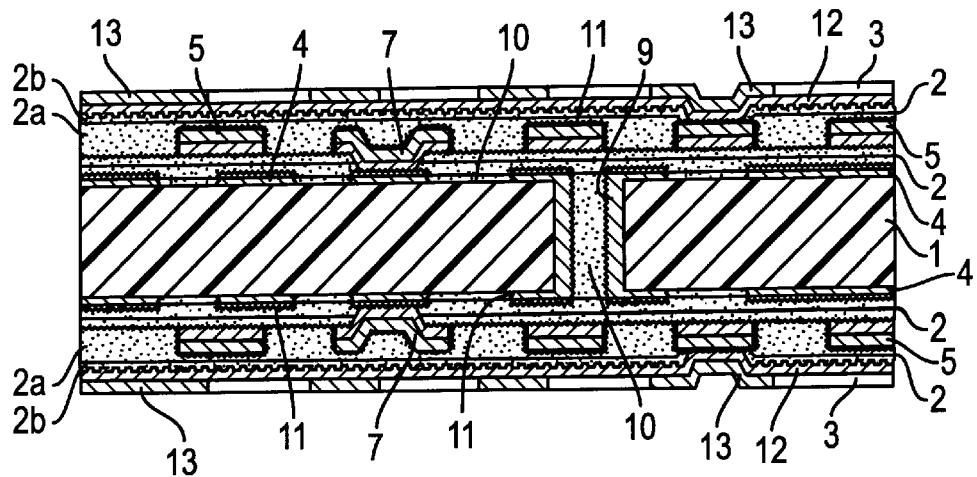
Figure 43:
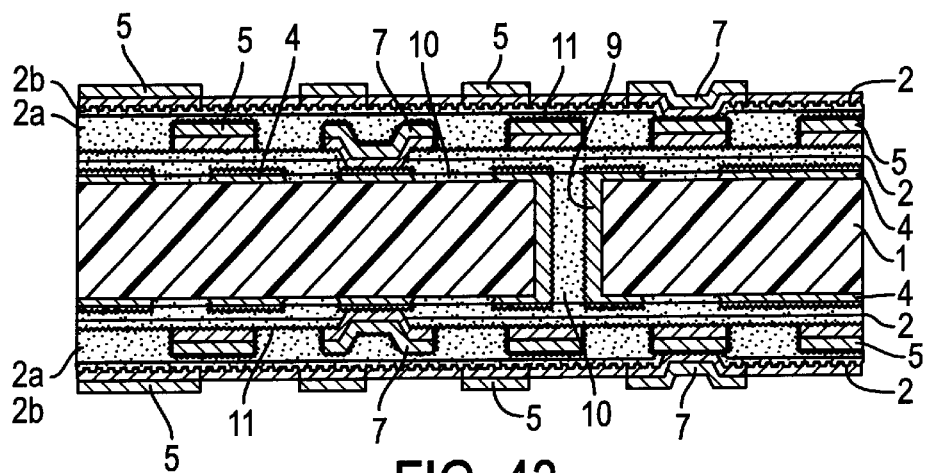
Figure 44:
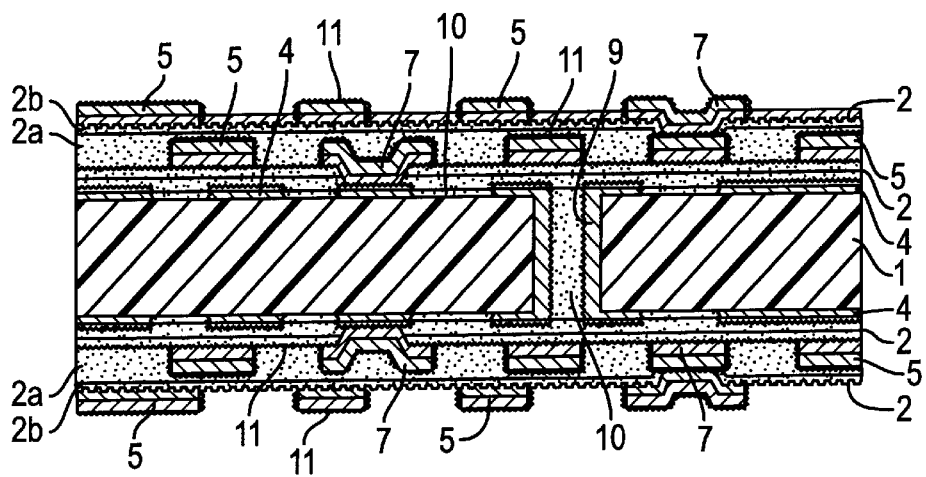

(13) The substrate provided with the conductor circuits 5 was immersed in an electroless plating aqueous solution of pH=9 comprising 8 g/l of copper sulfate, 0.6 g/l of nickel sulfate, 15 g/l of citric acid, 29 g/l of sodium hypophosphite, 31 g/l of boric acid and 0.1 g/l of surfactant to form a roughened layer 11 of copper-nickel-phosphorus having a thickness of 3 μm on the surface of the conductor circuit 5 (see FIG. 38). In this case, the resulting roughened layer 11 had a composition ratio of Cu: 98 mol %, Ni: 1.5 mol % and P: 0.5 mol % as analyzed by EPMA (electro probe microanalysis).

Further, Cu—Sn substitution reaction was carried out by immersing in a solution of 0.1 mol/l of tin borofluoride and 1.0 mol/l of thiourea at a temperature of 50° C. and pH=1.2 to form a Sn layer having a thickness of 0.3 μm on the surface of the roughened layer 11 (the Sn layer is not shown).

(14) Steps (6)–(13) were repeated to further form an upper layer of conductor circuits to thereby produce a multilayer wiring substrate. However, Sn substitution was not conducted (see FIGS. 39–44).

(15) On the other hand, a solder resist composition was prepared by mixing 46.67 parts by weight of a photosensitized oligomer (molecular weight: 4000) obtained by acrylating 50% of epoxy group in cresol novolac epoxy resin (made by Nippon Kayaku Co., Ltd.), 14.121 parts by weight of bisphenol A epoxy resin (made by Yuka Shell Co., Ltd. trade name: Epikote 1001), 1.6 parts by weight of an imidazole curing agent (made by Shikoku Kasei Co., Ltd. trade name: 2E4MZ-CN), 1.5 parts by weight of a polyvalent acrylic monomer (made by Nippon Kayaku Co., Ltd. trade name: R604) as a photosensitive monomer, 3.0 parts by weight of a polyvalent acrylic monomer (made by Kyoeisha Kagaku Co., Ltd. trade name: DPE6A), 0.36 part by weight of a polymer of acrylic ester, 2.0 parts by weight of Irgaquar 1-907 (trade name, made by Ciba Geigey) as a photoinitiator, 0.2 part by weight of DETX-S (trade name, made by Nippon Kayaku Co., Ltd.) as a photosensitizer and 1.0 part by weight of DMDG (diethylene glycol dimethyl ether) and adjusting the viscosity to 1.4±0.3 Pa·s at 25° C.

Moreover, the measurement of the viscosity is carried out by means of a B viscometer (made by Tokyo Keiki Co., Ltd. DVL-B model) with a rotor No. 4 in the case of 60 rpm or a rotor No. 3 in the case of 6 rpm.

(16) The above solder resist composition was applied onto both surfaces of multilayer wiring substrate obtained in the step (14) at a thickness of 20 μm. Then, the substrate was dried at 70° C. for 20 minutes and at 70° C. for 30 minutes and a photomask film of 5 mm in thickness depicted with circle pattern (mask pattern) was placed thereon and then exposed to ultraviolet rays at 1000 mJ/cm$^2$ and developed with DMTG. Further, it was heated at 80° C. for 1 hour, at 120° C. for 1 hour, at 120° C. for 1 hour and at 150° C. for 3 hours to form a solder resist layer 14 (thickness: 20 μm) opened in the pad portion (including viahole and its land portion, opening size: 200 μm).

(17) The substrate provided with the solder resist layer 14 was immersed in an electroless nickel plating aqueous solution of pH=5 comprising 30 g/l of nickel chloride, 10 g/l of sodium hypophosphite and 10 g/l of sodium citrate to form a nickel plated layer 15 having a thickness of 5 μm in the opening portion. Further, the substrate was immersed in an electroless gold plating aqueous solution comprising 2 g/l of potassium gold cyanide, 75 g/l of ammonium chloride, 50 g/l of sodium citrate and 10 g/l of sodium hypophosphite at 93° C. for 23 seconds to form a gold plated layer 16 having a thickness of 0.03 μm on the nickel plated layer 15.

Figure 45:
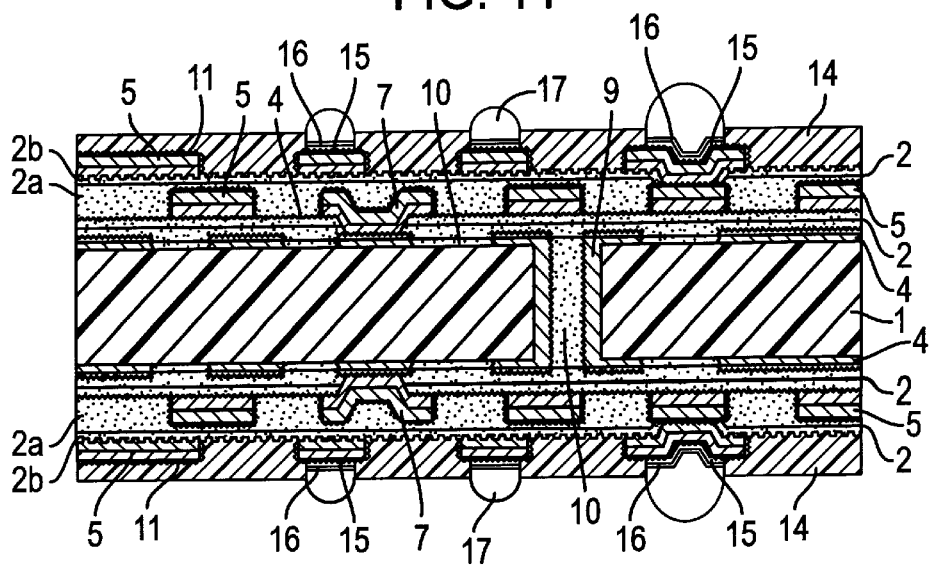

(18) A solder paste was printed on the opening portion of the solder resist layer 14 and reflowed at 200° C. to form solder bumps (solder body) 17, whereby there was produced a printed circuit board having solder bumps (see FIG. 45).

COMPARATIVE EXAMPLE 8

A printed circuit board having solder bumps was produced in the same manner as in Example 1 except that the flat-type conductor pad 18 and viahole 180 are formed on the upper layer by repeating steps (6)–(12) in step (14) of Example 1 without forming the roughened layer 11 on the surface thereof.

After an IC chip was mounted onto each of the printed circuit boards of Examples 4, 5 and 6 and Comparative Example 8, heat cycle tests of 1000 cycles and 2000 cycles under conditions of –55° C. for 15 minutes, room temperature for 10 minutes and 125° C. for 15 minutes were carried out.

Further, PCT test (pressure cooker test) was carried out under conditions of humidity of 100%, a temperature of 121° C. and a 2 atmospheric pressure for 200 hours.

The evaluation of these tests were carried out by the presence or absence of occurrences of peeling of the solder resist layer and solder body as confirmed by a microscope. The results are shown in Table 4.

When the solder resist layer of Example 6 was compared with the solder resist layer of Example 1, air-bubble was observed in Example 1, but not observed in Example 6. And also, the solder resist layer of Example 6 was high in light permeation and excellent in developing property as compared with the solder resist layer of Example 1.

TABLE 4

|  | Peeling of solder body | | Peeling of solder resist layer |
| --- | --- | --- | --- |
|  | 1000 cycles | 2000 cycles |  |
| Example 4 | none | none | none |
| Example 5 | none | none | none |
| Example 6 | none | none | none |
| Comparative Example 8 | yes | yes | yes |

As seen from the results of Table 4, according to the invention, peeling between the conductor circuit and the solder resist layer hardly occurs in the heat cycle or under conditions of high temperature, high humidity and high pressure, and also peeling of the solder bump (solder body) from the solder pad was not caused even in the case of mounting the IC chip or the like.

As mentioned above, it was possible to simultaneously apply the solder resist composition according to the invention onto both surfaces of the substrate by means of a roll coater and lead migration was not caused. Further, oxide film is not formed on the surface of the conductor pad, so that no hallow phenomenon and no peeling of the solder resist layer due to heat cycle is caused.

In the printed circuit board according to the invention, peeling of the solder resist layer can effectively be prevented in the heat cycle or under conditions of high temperature, high humidity and high pressure.

Furthermore, according to the invention, the formation of the solder body can be accomplished by solder transferring or solder printing to ensure mass productivity of the printed circuit board, and peeling of solder resist layers and peeling of solder bumps can be prevented in the heat cycle without damaging mass productivity.

What is claimed is:

1. A solder resist composition comprising an acrylate of novolac epoxy resin and an imidazole curing agent and having a viscosity of 0.5–10 Pa·s at 25° C. adjusted by using a glycol ether solvent comprising at least one of diethylene glycol dimethyl ether and triethylene glycol dimethyl ether.

2. A solder resist composition according to claim 1, wherein the imidazole curing agent is liquid at room temperature.

3. A solder resist composition according to claim 1, further comprising a polymer of acrylic ester.

4. A printed circuit board comprising a wiring substrate provided with conductor circuits and a solder resist layer formed on a surface of the wiring substrate and the conductor circuits, in which the solder resist layer is formed by curing a solder resist composition comprising an acrylate of novolac epoxy resin and an imidazole curing agent and having a viscosity of 0.5–10 Pa·s at 25° C. adjusted by using a glycol ether solvent comprising at least one of diethylene glycol dimethyl ether and triethylene glycol dimethyl ether.

5. A printed circuit board according to claim 4, wherein the solder resist layer further comprises a polymer of acrylic ester.

6. A printed circuit board comprising a wiring substrate provided with conductor circuits, at least one insulating layer which is on and covers at least a portion of the wiring substrate and the conductor circuits, wherein the conductor circuits contact the wiring substrate and at least one insulating layer, a solder resist layer formed on the at least one insulating layer, wherein a roughened layer is formed on a surface of at least one of the conductor circuits, wherein a portion of the roughened layer is exposed from an opening formed in the solder resist layer, wherein the roughened layer comprises a copper-nickel-phosphorus alloy layer.

7. A printed circuit board according to claim 6, wherein the roughened layer has a thickness of 0.5–10 μm.

8. A printed circuit board according to claim 6, wherein the solder resist layer is made from a solder resist composition comprising novolac epoxy resin or an acrylate of novolac epoxy resin and an imidazole curing agent.

9. A printed circuit board according to claim 6, wherein the solder resist layer is formed by curing a solder resist composition comprising an acrylate of novolac epoxy resin and an imidazole curing agent and having a viscosity of 0.5–10 Pa·s at 25° C. adjusted by using a glycol ether solvent.

10. A printed circuit board according to claim 8, wherein the solder resist composition contains a polymer of acrylic ester.

11. A printed circuit board according to claim 6, wherein the solder resist layer has a thickness of 5–30 μm.

12. A printed circuit board according to claim 6, wherein the wiring substrate is formed by forming a plating resist on a roughened surface of an insulating resin layer and then forming a conductor circuit on the insulating layer where no plating resist is formed.

13. A printed circuit board comprising a wiring substrate provided with conductor circuits, at least one insulating layer which is on and covers at least a portion of the wiring substrate and the conductor circuits, wherein the conductor circuits contact the wiring substrate and at least one insulating layer, a solder resist layer formed after the conductor circuits and on the at least one insulating layer, the solder resist layer and the at least one insulating layer having an opening portion, a pad on the conductor circuits which pad is exposed at the opening portion in the solder resist layer and the at least one insulating layer, and a solder body on the pad, wherein the solder resist layer is made from a composition comprising an acrylate of novolac epoxy resin and an imidazole curing agent, wherein the pad contacts the conductor circuits through the opening in the insulating resin layer.

14. A printed circuit board comprising a wiring substrate provided with conductor circuits, at least one insulating layer which is on and covers at least a portion of the wiring substrate and the conductor circuits, wherein the conductor circuits contact the wiring substrate and at least one insulating layer, a solder resist layer formed after the conductor circuits and on a surface of the at least one insulating layer, the solder resist layer and the at least one insulating layer having an opening portion, a pad on the conductor circuits which pad is exposed at the opening portion in the solder resist layer and the at least one insulating layer, and a solder body on the pad, wherein a surface of the pad exposed at the opening portion is rendered into an electrically conductive roughened layer, and a metal layer including a non-oxidizing metal on at least a surface of the metal layer, the metal layer being on the surface of the pad exposed at the opening portion, and the solder is supported on the pad through the metal layer.

15. A printed circuit board comprising a wiring substrate provided with conductor circuits, at least one insulating layer which is on and covers at least a portion of the wiring substrate and the conductor circuits, wherein the conductor circuits contact the wiring substrate and at least one insulating layer, a solder resist layer formed after the conductor circuits and on a surface of the at least one insulating layer, the solder resist layer and the at least one insulating layer having an opening portion, a pad on the conductor circuits which pad is exposed at the opening portion in the solder resist layer and the at least one insulating layer, and a solder body on the pad, wherein a surface of at least one of the conductor circuits exposed at the opening portion is rendered into an electrically conductive roughened layer, and a metal layer including a non-oxidizing metal on at least a surface of the metal layer, the metal layer being on the surface of the pad exposed at the opening portion, and the solder is supported on the pad through the metal layer.

16. A printed circuit board according to claim 14, wherein full surface of the pad is exposed in the opening portion.

17. A printed circuit board according to claim 14, wherein a part of the surface of the pad is exposed in the opening portion.

18. A printed circuit board according to claim 14, wherein the metal layer is comprised of nickel layer on the pad and gold layer on the nickel layer.

19. A printed circuit board according to claim 14, wherein the metal layer is comprised of copper layer on the pad, nickel layer on the copper layer, and gold layer on the nickel layer.

20. A printed circuit board according to claim 14, wherein the electrically conductive roughened layer has a thickness of 0.5–10 µm.

21. A printed circuit board according to claim 14, wherein the electrically conductive roughened layer is copper-nickel-phosphorus alloy layer.

22. A printed circuit board according to claim 13, wherein the wiring substrate is formed by forming a plating resist on a roughened surface of the insulating resin layer and then forming at least a portion of the conductor circuits on the insulating layer where no plating resist is formed.

23. A printed circuit board according to claim 13, wherein the solder resist layer is formed by curing a solder resist composition comprising an acrylate of novolac epoxy resin and an imidazole curing agent and having a viscosity of 0.5–10 Pa·s at 25° C. adjusted by using a glycol ether solvent.

24. A printed circuit board according to claim 23, wherein the solder resist composition contains a polymer of acrylic ester.

25. A printed circuit board according to claim 13, wherein the solder resist layer has a thickness of 5–30 µm.

26. A printed circuit board comprising an insulating layer, a conductor circuit formed thereon, the conductor circuit comprising an electrolytic film on an electroless plated film, a roughened layer formed on at least a part of a surface of the electrolytic film and a solder resist layer covering at least a portion of the conductor circuit, the solder resist layer having an opening portion, the conductor circuit contacting a solder pad comprising a gold layer on a nickel layer, the solder pad being in the opening portion of the solder resist layer.

27. A printed circuit board comprising an insulating layer, a solder pad formed thereon, the solder pad comprising a gold layer on a nickel layer on an electrolytic film on an electroless plated film, a roughened layer formed on at least a part of a surface of the electrolytic film and a solder body formed on the solder pad.

28. The solder resist composition of claim 1, wherein the viscosity is 1–10 Pa·s.

29. The solder resist composition of claim 1, wherein the viscosity is 2–3 Pa·s.

30. The printed circuit board of claim 4, wherein the viscosity is 1–10 Pa·s.

31. The printed circuit board of claim 4, wherein the viscosity is 2–3 Pa·s.

32. The solder resist composition of claim 1, further comprising a polymer of acrylic ester having a molecular weight of about 500–5000 obtained by reacting alcohol having a carbon number of about 1–10 with one of acrylic acid and methacrylic acid.

33. The printed circuit board of claim 4, wherein the solder resist composition further comprises a polymer of acrylic ester having a molecular weight of about 500–5000 obtained by reacting alcohol having a carbon number of about 1–10 with one of acrylic acid and methacrylic acid.

* * * * *

UNITED STATES PATENT AND TRADEMARK OFFICE
CERTIFICATE OF CORRECTION

PATENT NO. : 6,217,987 B1
DATED : April 17, 2001
INVENTOR(S) : Y. Ono et al.

It is certified that error appears in the above-identified patent and that said Letters Patent is hereby corrected as shown below:

<u>Title page,</u>
Item [56], References Cited, FOREIGN PATENT DOCUMENTS, the following were omitted and should be inserted:
-- 2257714    1/1993    United Kingdom
   670379    9/1995    EPO --

Signed and Sealed this

Eighth Day of October, 2002

Attest:

Attesting Officer

JAMES E. ROGAN
*Director of the United States Patent and Trademark Office*